(12) United States Patent
Tonkikh

(10) Patent No.: US 12,349,528 B2
(45) Date of Patent: Jul. 1, 2025

(54) STRAIN MANAGEMENT OF III-P MICRO-LED EPITAXY TOWARDS HIGHER EFFICIENCY AND LOW BOW

(71) Applicant: Meta Platforms Technologies, LLC, Menlo Park, CA (US)

(72) Inventor: Alexander Tonkikh, Cork (IE)

(73) Assignee: Meta Platforms Technologies, LLC, Menlo Park, CA (US)

( * ) Notice: Subject to any disclaimer, the term of this patent is extended or adjusted under 35 U.S.C. 154(b) by 652 days.

(21) Appl. No.: 17/510,263

(22) Filed: Oct. 25, 2021

(65) Prior Publication Data

US 2023/0131918 A1    Apr. 27, 2023

(51) Int. Cl.
| | | |
|---|---|---|
| *H10H 20/824* | (2025.01) | |
| *H10H 20/01* | (2025.01) | |
| *H10H 29/14* | (2025.01) | |
| *H01L 25/18* | (2023.01) | |

(52) U.S. Cl.
CPC ........ *H10H 29/142* (2025.01); *H10H 20/013* (2025.01); *H01L 25/18* (2013.01)

(58) Field of Classification Search
None
See application file for complete search history.

(56) References Cited

U.S. PATENT DOCUMENTS

| | | |
|---|---|---|
| 7,684,458 B2 | 3/2010 | Sato et al. |
| 9,865,772 B2 | 1/2018 | Bour et al. |
| 10,205,303 B1 | 2/2019 | Hegblom |
| 2004/0156408 A1* | 8/2004 | Tanaka ............ B82Y 20/00 372/45.01 |
| 2005/0030997 A1* | 2/2005 | Tanaka ............ H01S 5/34326 372/46.01 |
| 2006/0169993 A1* | 8/2006 | Fan .................. H10H 29/14 257/89 |
| 2006/0192212 A1* | 8/2006 | Song ................ H01L 33/16 257/79 |

(Continued)

FOREIGN PATENT DOCUMENTS

| | | |
|---|---|---|
| DE | 102019119991 A1 | 1/2021 |
| EP | 3659187 A1 | 6/2020 |
| WO | WO-2020182457 A1 | 9/2020 |

OTHER PUBLICATIONS

International Search Report and Written Opinion for International Application No. PCT/US2022/046808, mailed Feb. 9, 2023, 10 pages.

*Primary Examiner* — Bilkis Jahan
(74) *Attorney, Agent, or Firm* — Greenberg Traurig, LLP

(57) ABSTRACT

A micro-light emitting diode (micro-LED) wafer includes a substrate, an n-type semiconductor layer grown on the substrate, an active region grown on the n-type semiconductor layer and configured to emit visible light, and a p-type semiconductor layer grown on the active region. The active region includes a compressive-strained quantum well layer and compressive-strained quantum barrier layers. At least one of the p-type semiconductor layer or the n-type semiconductor layer includes a tensile-strained layer having a thickness greater than about 50 nm, such that the tensile-strained layers can counter the compressive strain of the active region, thereby reducing the overall strain and bow of the micro-LED wafer.

20 Claims, 19 Drawing Sheets

(56) References Cited

U.S. PATENT DOCUMENTS

| | | | |
|---|---|---|---|
| 2009/0103583 A1* | 4/2009 | Tanaka | H01S 5/183 372/45.01 |
| 2010/0187496 A1* | 7/2010 | Yan | H10H 20/815 438/47 |
| 2011/0057213 A1 | 3/2011 | Romano et al. | |
| 2012/0257170 A1* | 10/2012 | Mochizuki | G02B 6/29332 353/30 |
| 2013/0270519 A1* | 10/2013 | Sun | H10H 20/812 438/47 |
| 2014/0138614 A1 | 5/2014 | Sugiyama et al. | |
| 2014/0218701 A1* | 8/2014 | Nishioka | H04N 9/315 257/98 |
| 2015/0255958 A1* | 9/2015 | Enya | H10H 20/815 257/201 |
| 2016/0190386 A1* | 6/2016 | Nishioka | H10H 20/042 257/98 |
| 2017/0052433 A1* | 2/2017 | Miyasaka | B22F 7/004 |
| 2017/0052435 A1* | 2/2017 | Nishioka | H01L 33/0045 |
| 2017/0068362 A1* | 3/2017 | Den Boer | H01L 25/0753 |
| 2019/0103509 A1* | 4/2019 | Lachab | H01L 29/00 |
| 2020/0052137 A1 | 2/2020 | Maros et al. | |

\* cited by examiner

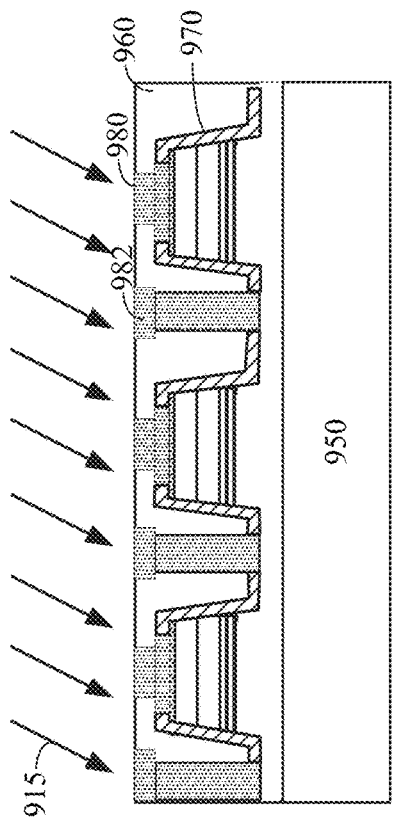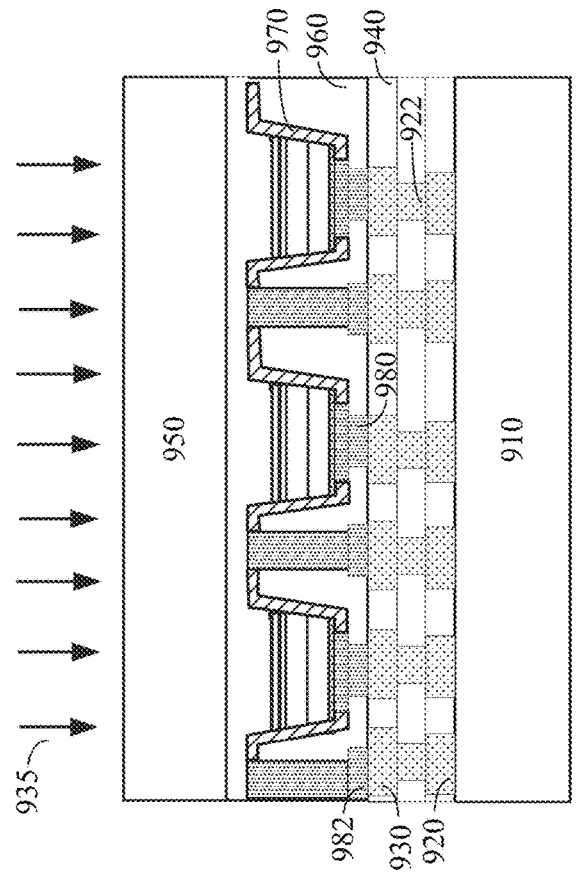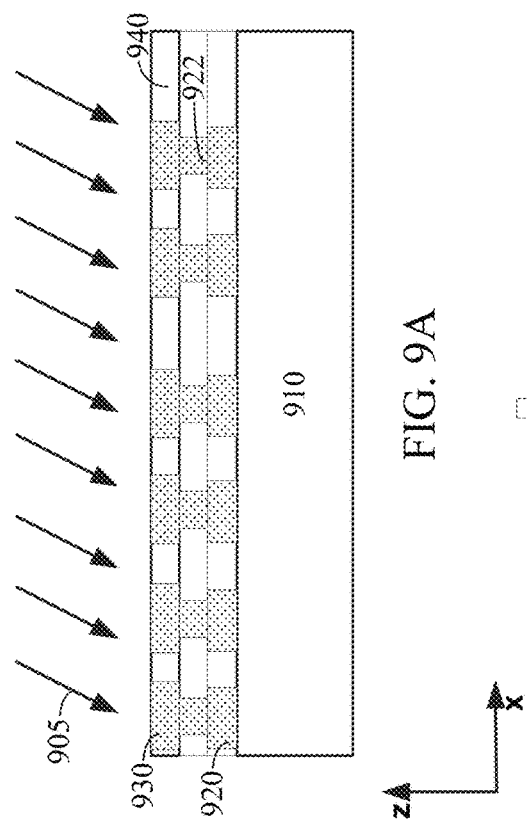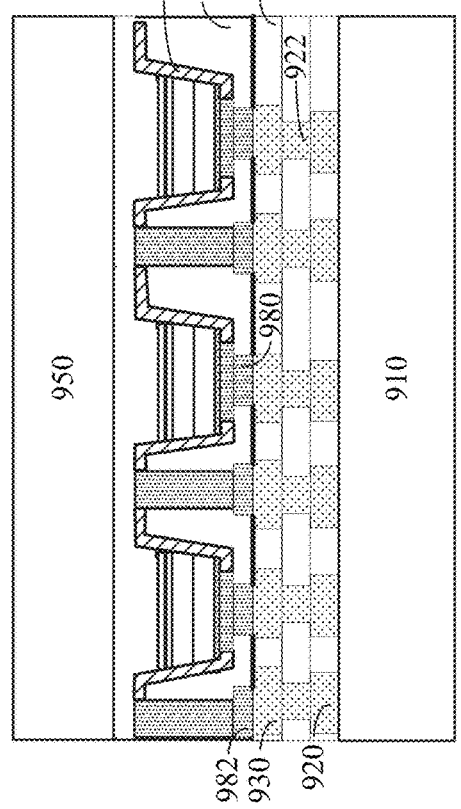

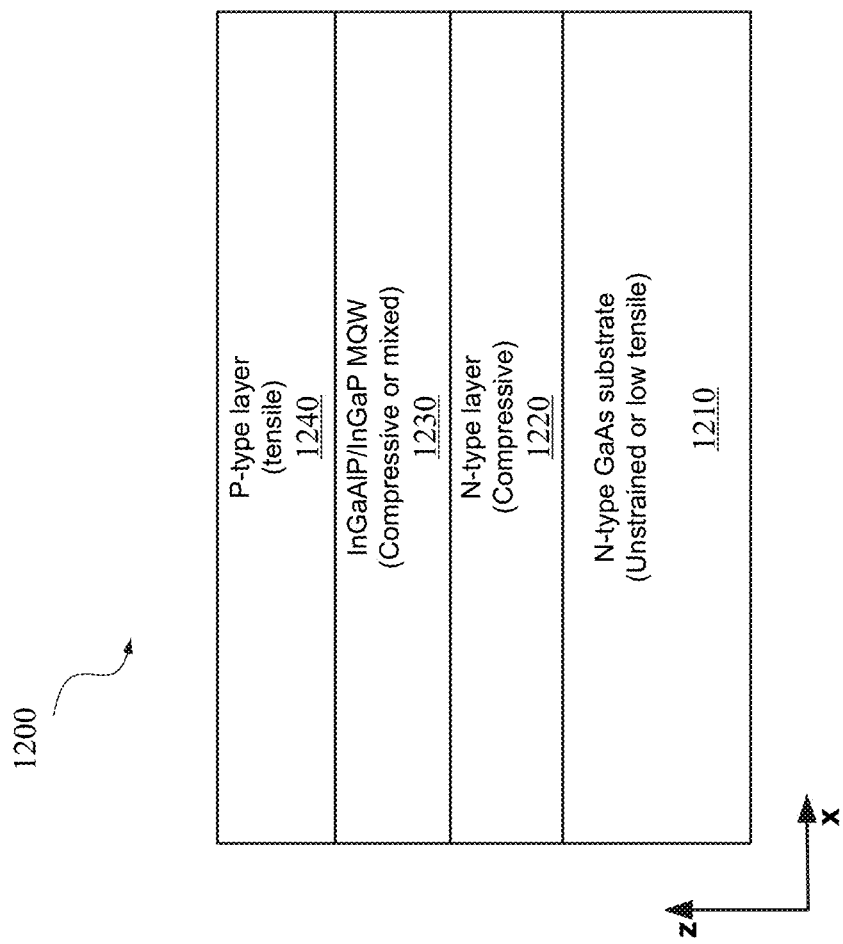
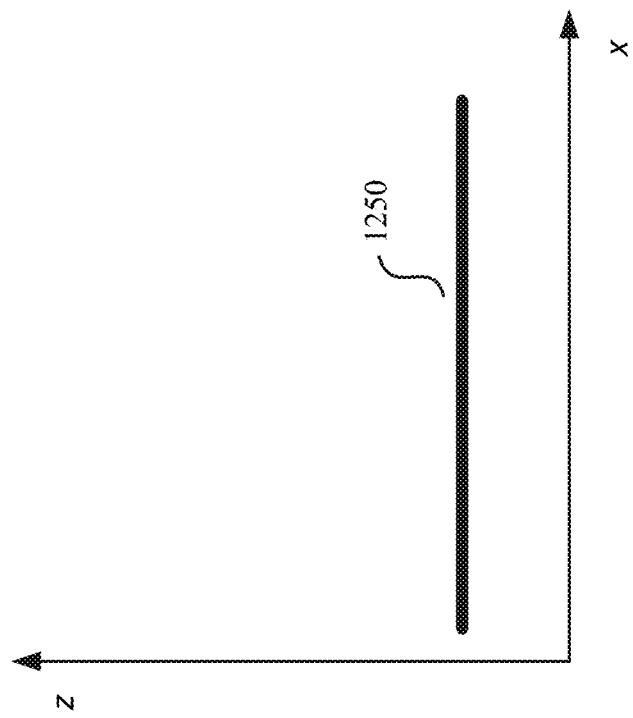
FIG. 12A
FIG. 12B

STRAIN MANAGEMENT OF III-P MICRO-LED EPITAXY TOWARDS HIGHER EFFICIENCY AND LOW BOW

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("µLEDs") based on III-V semiconductors, such as alloys of AlN, GaN, InN, GaAs, GaInP, AlGaInP, other quaternary phosphide compositions, and the like, have begun to be developed for various display applications due to their small size, high packing density, higher resolution, and high brightness. For example, micro-LEDs that emit light of different colors (e.g., red, green, and blue) can be used to form the sub-pixels of a display system, such as a television or a near-eye display system.

SUMMARY

This disclosure relates generally to micro light emitting diodes (micro-LEDs). More specifically, techniques disclosed herein relate to using tensile-strained epitaxial layers and compressive-strained epitaxial layers to balance strain in the epitaxial layers, thereby reducing wafer bow and improving efficiencies of micro-LEDs. Various inventive embodiments are described herein, including devices, wafers, systems, structures, methods, materials, processes, and the like.

According to certain embodiments, a micro-LED wafer may include a substrate, an n-type semiconductor layer grown on the substrate, an active region grown on the n-type semiconductor layer and configured to emit visible light, and a p-type semiconductor layer grown on the active region. The active region may include a compressive-strained quantum well layer and compressive-strained quantum barrier layers. At least one of the p-type semiconductor layer or the n-type semiconductor layer may include a tensile-strained layer having a thickness greater than about 50 nm.

In some embodiments of the micro-LED wafer, the tensile-strained layer is in the p-type semiconductor layer. The tensile-strained layer may increase a potential barrier for electrons at the p-type semiconductor layer. The tensile-strained layer may include, for example, a p-doped $(In_xAl_{1-x})_{0.5}P$, $(In_xGa_{1-x})_{0.5}P$, or $(In_x(GaAl)_{1-x})_{0.5}P_{0.5}$ layer in the p-type semiconductor layer, where x may be, for example, less than about 0.5.

In some embodiments of the micro-LED wafer, the tensile-strained layer is in the p-type semiconductor layer, and the n-type semiconductor layer includes a second tensile-strained layer. The tensile-strained layer may be characterized by a lattice constant lower than a lattice constant of the substrate and a lattice constant of the active region. The tensile-strained layer may be characterized by a diffraction peak greater than about 50 arcseconds with respect to a diffraction peak of the substrate in an X-ray diffraction (XRD) diagram. In some embodiments, the substrate includes a GaAs substrate or a GaAs substrate with a GaAs buffer layer, and the active region includes one or more InGaAlP quantum barrier layers and at least one InGaP quantum well layer and is configured to emit red light. In some embodiments, a total bow of the micro-LED wafer may be less than about 10 µm.

According to some embodiments, a device may include a substrate and an array of micro-light emitting diodes on the substrate. Each micro-light emitting diode of the array of micro-light emitting diode may include a mesa structure that includes an n-type semiconductor layer on the substrate, an active region grown on the n-type semiconductor layer and configured to emit visible light, and a p-type semiconductor layer on the active region. The active region may include a compressive-strained quantum well layer and compressive-strained quantum barrier layers. At least one of the p-type semiconductor layer or the n-type semiconductor layer includes a tensile-strained layer having a thickness greater than about 50 nm.

In some embodiments, the tensile-strained layer is in the p-type semiconductor layer and increases a potential barrier for electrons at the p-type semiconductor layer. In some embodiments, the tensile-strained layer is in the p-type semiconductor layer and the n-type semiconductor layer includes a second tensile-strained layer. In some embodiments, the tensile-strained layer is characterized by a lattice constant lower than a lattice constant of the substrate and a lattice constant of the active region. In some embodiments, the tensile-strained layer is characterized by a diffraction peak greater than about 50 arcseconds with respect to a diffraction peak of the substrate in an X-ray diffraction (XRD) diagram. In some embodiments, the substrate includes a GaAs substrate or a GaAs substrate with a GaAs buffer layer, and the active region includes one or more InGaAlP quantum barrier layers and at least one InGaP quantum well layer and is configured to emit red light.

According to some embodiments, a method may include epitaxially growing an n-type semiconductor layer on a substrate, epitaxially growing an active region on the n-type semiconductor layer, and epitaxially growing a p-type semiconductor layer on the active region. The active region may be configured to emit red light and may include a compressive-strained quantum well layer and compressive-strained quantum barrier layers. At least one of the p-type semiconductor layer or the n-type semiconductor layer may include a tensile-strained layer having a thickness greater than about 50 nm.

In some embodiments, the tensile-strained layer is in the p-type semiconductor layer and increases a potential barrier for electrons at the p-type semiconductor layer. In some embodiments, the tensile-strained layer is characterized by a diffraction peak greater than about 50 arcseconds with respect to a diffraction peak of the substrate in an X-ray diffraction (XRD) diagram. In some embodiments, the tensile-strained layer is characterized by a lattice constant lower than a lattice constant of the substrate and a lattice constant of the active region.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIGS. 9A-9D illustrate an example of a method of hybrid bonding for arrays of LEDs according to certain embodiments.

FIG. 12A illustrates an example of an epitaxial structure on a micro-LED wafer that may have balanced strain in epitaxial layers according to certain embodiments.

FIG. 12B shows that the micro-LED wafer of FIG. 12A including the strain balanced epitaxial structure may have little or no wafer bow.

Figure 1:
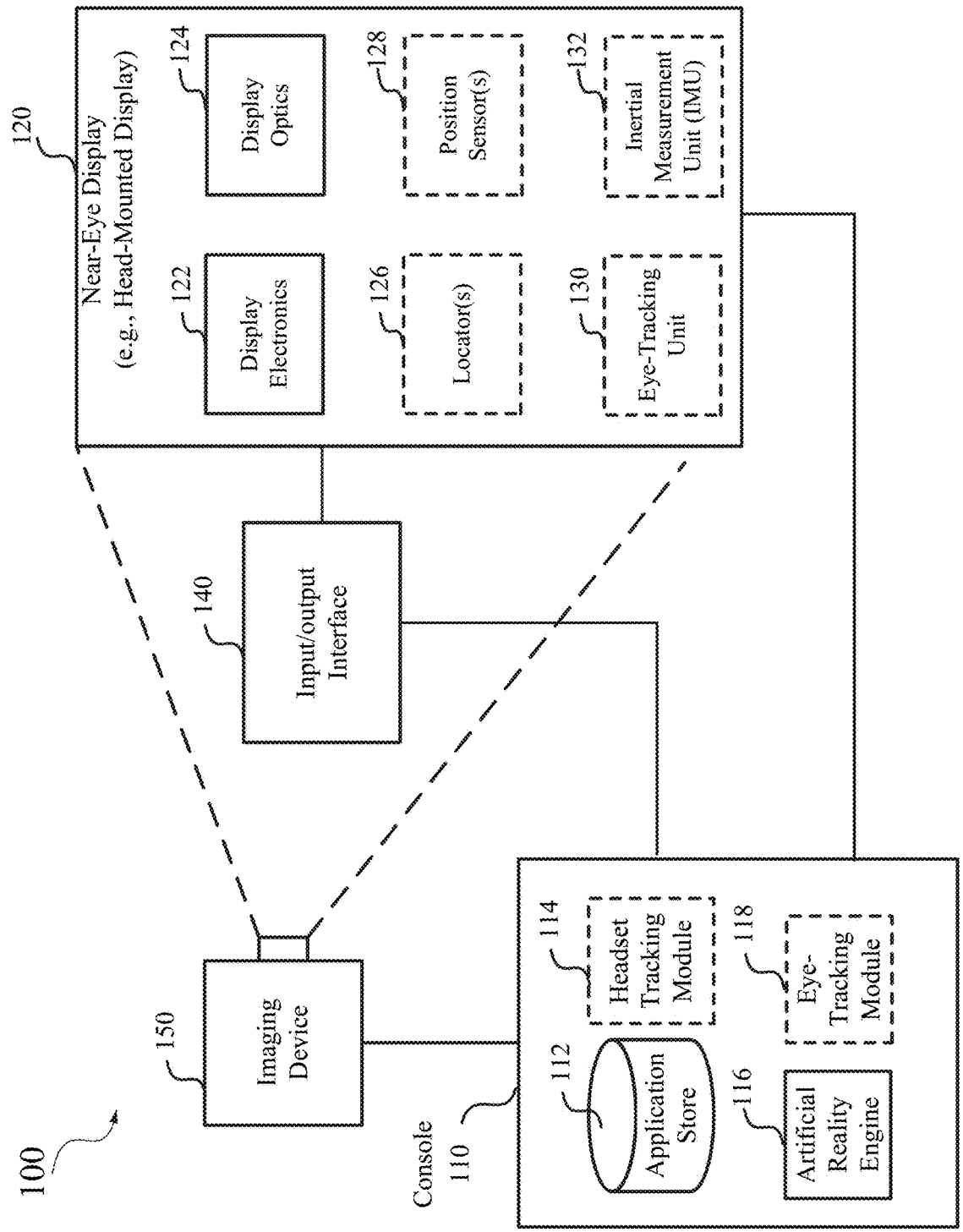
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to micro light emitting diodes (micro-LEDs). More specifically, techniques disclosed herein relate to using one or more tensile-strained epitaxial layers and compressive-strained epitaxial layers to balance strain in the epitaxial layers, thereby reducing wafer bow and improving efficiencies of micro-LEDs. Various inventive embodiments are described herein, including devices, wafers, systems, structures, methods, materials, processes, and the like.

In semiconductor light emitting diodes (LEDs), photons are usually generated at a certain internal quantum efficiency (IQE) through the recombination of electrons and holes within an active region or light emitting region. The active region may include one or more epitaxially grown semiconductor layers that may form one or more quantum wells. In general, it may be desirable to reduce strain (e.g., compressive or tensile strain) in the epitaxially grown semiconductor layers, because the strains may increase the defect density and thus the non-radiative recombination in the active region. The strains may also cause other effects, such as polarization states and internal electrical fields induced by the piezo- and spontaneous polarization.

In red micro-LEDs made in $In_xGa_yAl_zP_{0.5}$ epitaxial layers (where $0<x<0.5$, $0 \le y<0.5$, $0 \le z<0.5$, and $x+y+z=0.5$) grown on GaAs substrates, the n-type semiconductor (e.g., InGaAlP or InAlP) layer, the InGaAlP/InGaP multiple quantum well layers, and the p-type semiconductor (e.g., InGaAlP or InAlP) layer may generally have in-plane compressive strain due to, for example, the difference between the lattice constant of the GaAs substrate and the lattice constant of the $In_xGa_yAl_zP_{0.5}$ layers. Even though an $In_xGa_yAl_zP_{0.5}$ epitaxial layers may be grown to have either compressive in-plane strain or tensile in-plane strain on a GaAs wafer, in some cases, an $In_xGa_yAl_zP_{0.5}$ epitaxial layer grown with tensile strain or no strain (e.g., lattice matched to the GaAs substrate) may become compressive-strained at room temperature due to different coefficients of temperature expansion (CTEs) of the epitaxial layer and the GaAs substrate. In addition, in some embodiments, in order to improve the quantum efficiency of the micro-LEDs, it may be desirable that the multiple quantum well layers have in-plane compressive strain to increase the proportion of heavy holes and the effective mass of the holes, thereby reducing the mobility of the holes and the diffusion of the holes to the mesa sidewall regions that may cause non-radiative recombination at the mesa sidewall regions. However, the compressive strain in the epitaxial layers may cause a large bow of the wafer that includes the epitaxial layers grown thereon.

According to certain embodiments, the bow of a micro-LED wafer with epitaxial layers grown thereon, such as a GaAs wafer with $In_xGa_yAl_zP_{0.5}$ epitaxial layers, may be controlled by managing the in-plane strain in individual epitaxial layers. Some of the epitaxial layers may be grown to have compressive strain, while one or more other epitaxial layers may be grown to have tensile strain. The thickness of the epitaxial layers with tensile strain may be sufficiently high such that the tensile strain of these epitaxial layers may counter the compressive strain of other epitaxial layers, thereby reducing the net strain and the bow of the micro-LED wafer including the epitaxial layers. Due to the low bow of the micro-LED wafer, the bonding of the micro-LED wafer to a backplane may be easier, stronger, more accurate, and more reliable.

The compressive or tensile strain may be introduced in an epitaxial layer by changing the lattice constant of the epitaxial layer such that there may be a mismatch between the lattice constant of the epitaxial layer and an adjacent layer, such as the underlying epitaxial layer on which the epitaxial layer is grown. When the lattice constant of the epitaxial layer is lower than that of the adjacent layer, the adjacent layer may pull the crystal lattices of the epitaxial layer and thus there may be tensile strain in the epitaxial layer. When the lattice constant of epitaxial layer is greater than that of the adjacent layer, the adjacent layer may compress the crystal lattices of the epitaxial layer and thus there may be compressive strain in the epitaxial layer. The lattice constants of epitaxial layers may be changed by changing the composition of the epitaxial layers, such as the concentrations of In, Ga, or Al in $In_xGa_yAl_zP_{0.5}$ materials (where $0<x<0.5$, $0\le y<0.5$, $0\le z<0.5$, and $x+y+z=0.5$), during the epitaxial growth of the epitaxial layers.

According to certain embodiments, a tensile-strained p-type semiconductor layer for strain balancing and bow reduction may result in an improvement in the efficiency of micro-LEDs at high operating current densities and elevated temperatures. The tensile-strained p-type semiconductor layer may lead to higher potential barrier for electrons at the p-side of a p-n junction. For example, a tensile-strained layer with a diffraction peak at about 1000 arcsec with respect to the substrate diffraction peak in a high resolution X-ray diffraction (XRD) diagram may result in at least 30 meV increase in the potential barrier height at the p-side of the micro-LED. The increase in the potential barrier height may result in a lower leakage current and a higher wall plug efficiency (WPE) at elevated temperatures and/or high operating current densities.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light-emitting region (i.e., active region) between the n-type semiconductor layer and the p-type semiconductor layer. The light-emitting region may include one or more semiconductor layers that form one or more heterostructures, such as quantum wells. In some embodiments, the light-emitting region may include multiple semiconductor layers that form one or more multiple-quantum-wells (MQWs), each including multiple (e.g., about 2 to 8) quantum wells.

As used herein, the term "micro-LED" or "µLED" refers to an LED that has a chip where a lateral linear dimension (e.g., the diameter or a side) of the active region of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have active regions (e.g., mesas) with a linear dimension (e.g., length or diameter) comparable to the minority carrier diffusion length. However, the disclosure herein is not limited to micro-LEDs, and may also be applied to mini-LEDs. As used herein, the lateral linear size of a micro-LED may refer to the lateral linear dimension of the active region or the mesa structure of the micro-LED, such as the diameter or side of the mesa structure or the active region.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
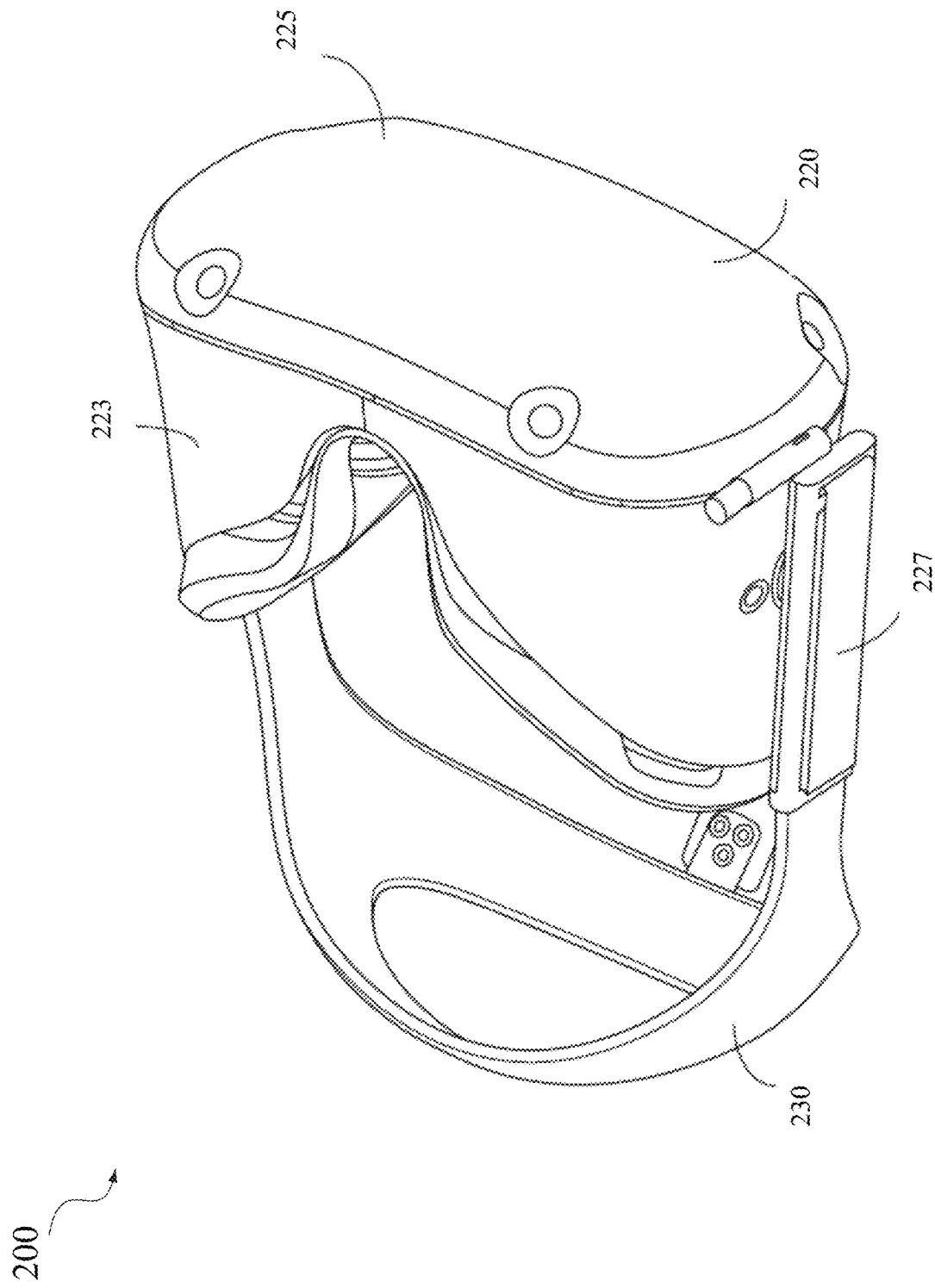
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
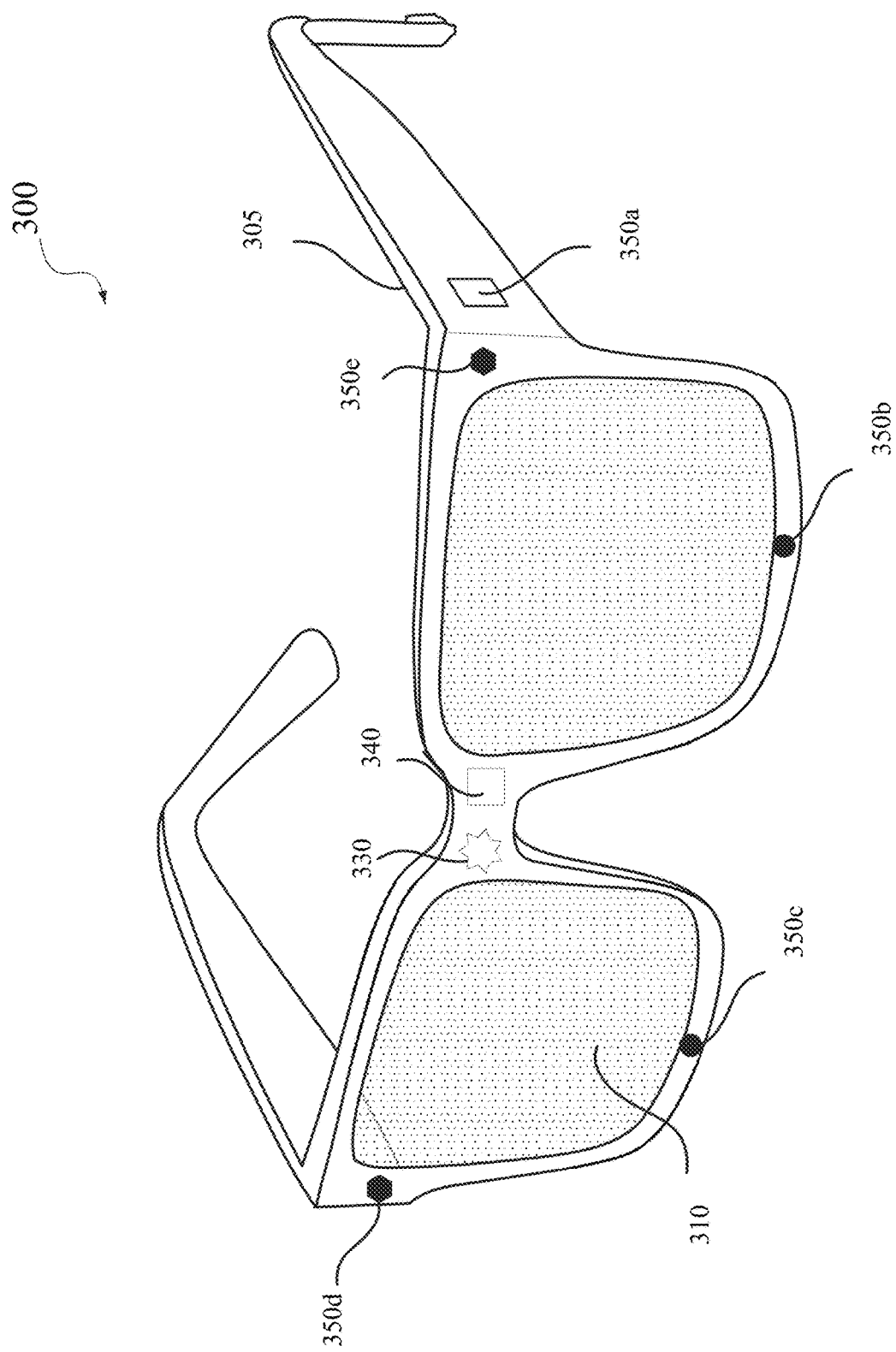
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
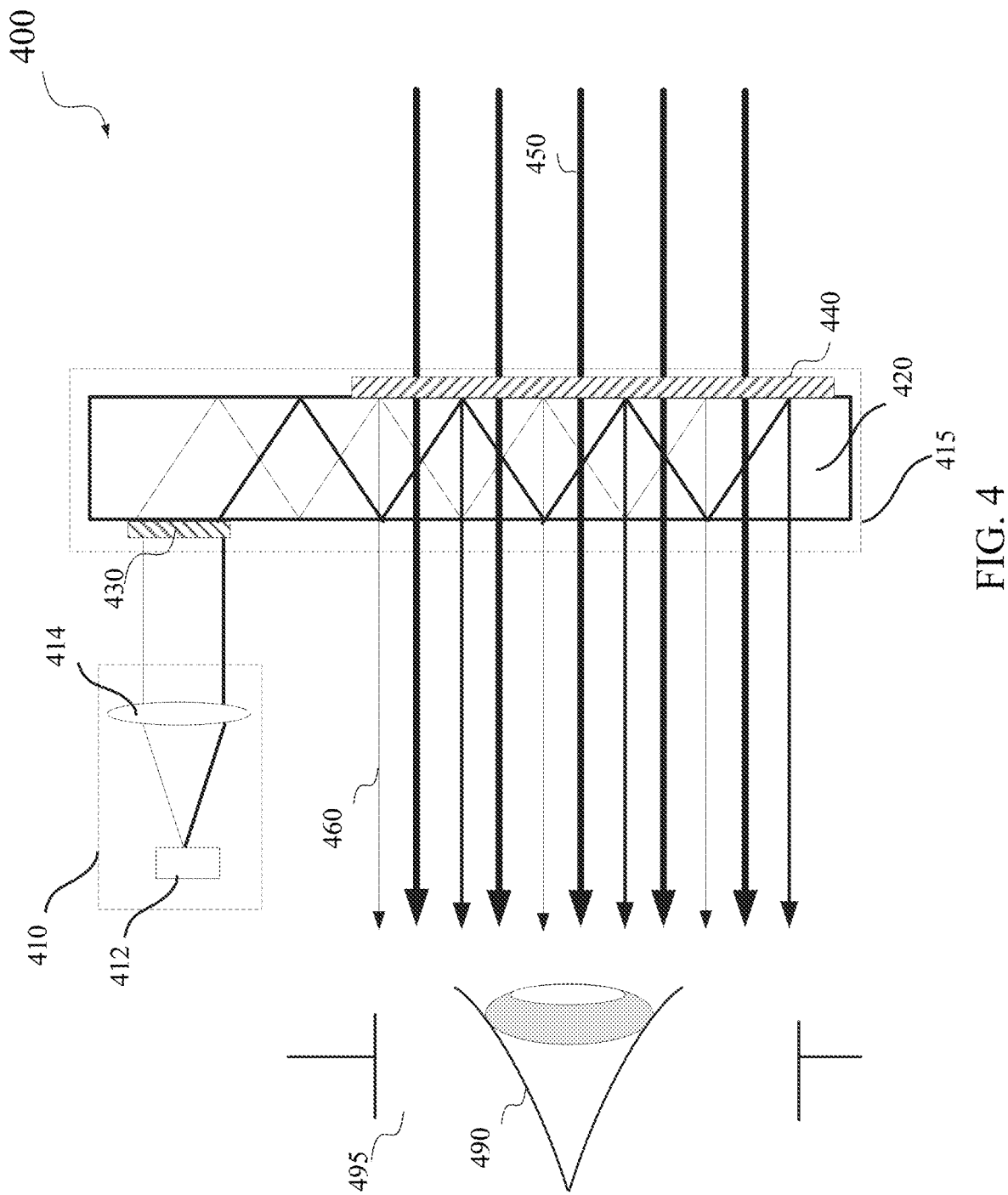
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

Figure 5B:
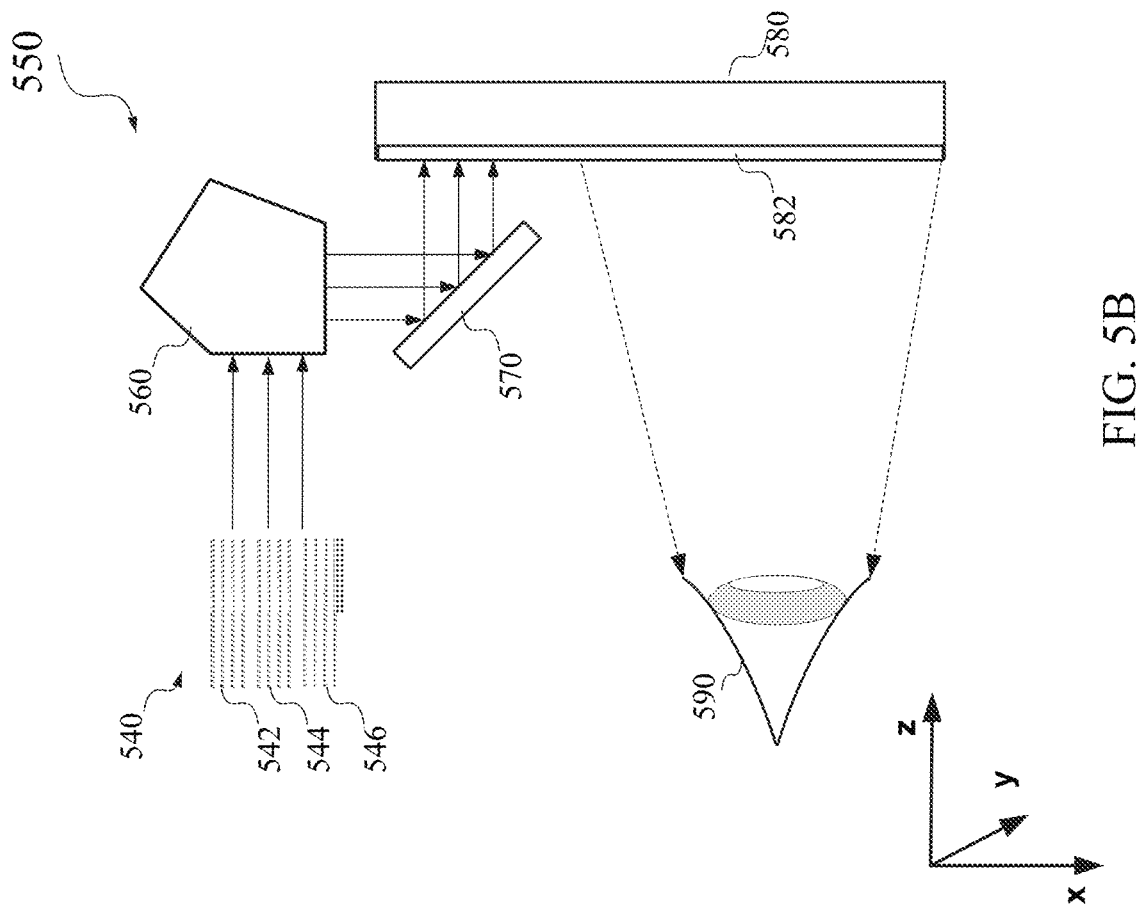
FIG. 5B illustrates an example of a near-eye display device including a waveguide display according to certain embodiments.
Figure 5A:
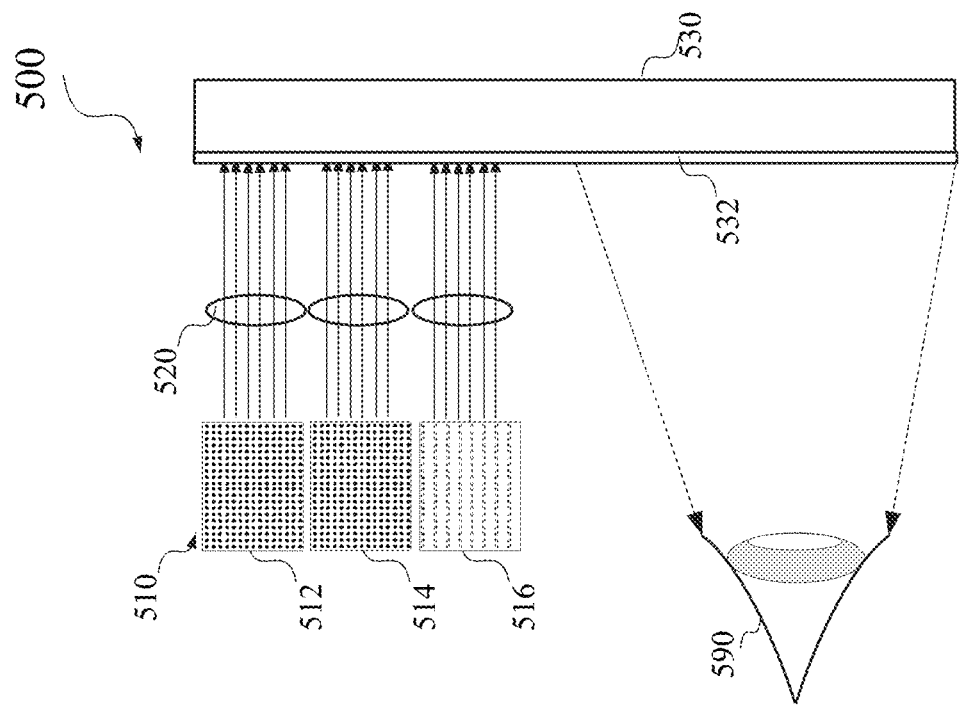
FIG. 5A illustrates an example of a near-eye display device including a waveguide display according to certain embodiments.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
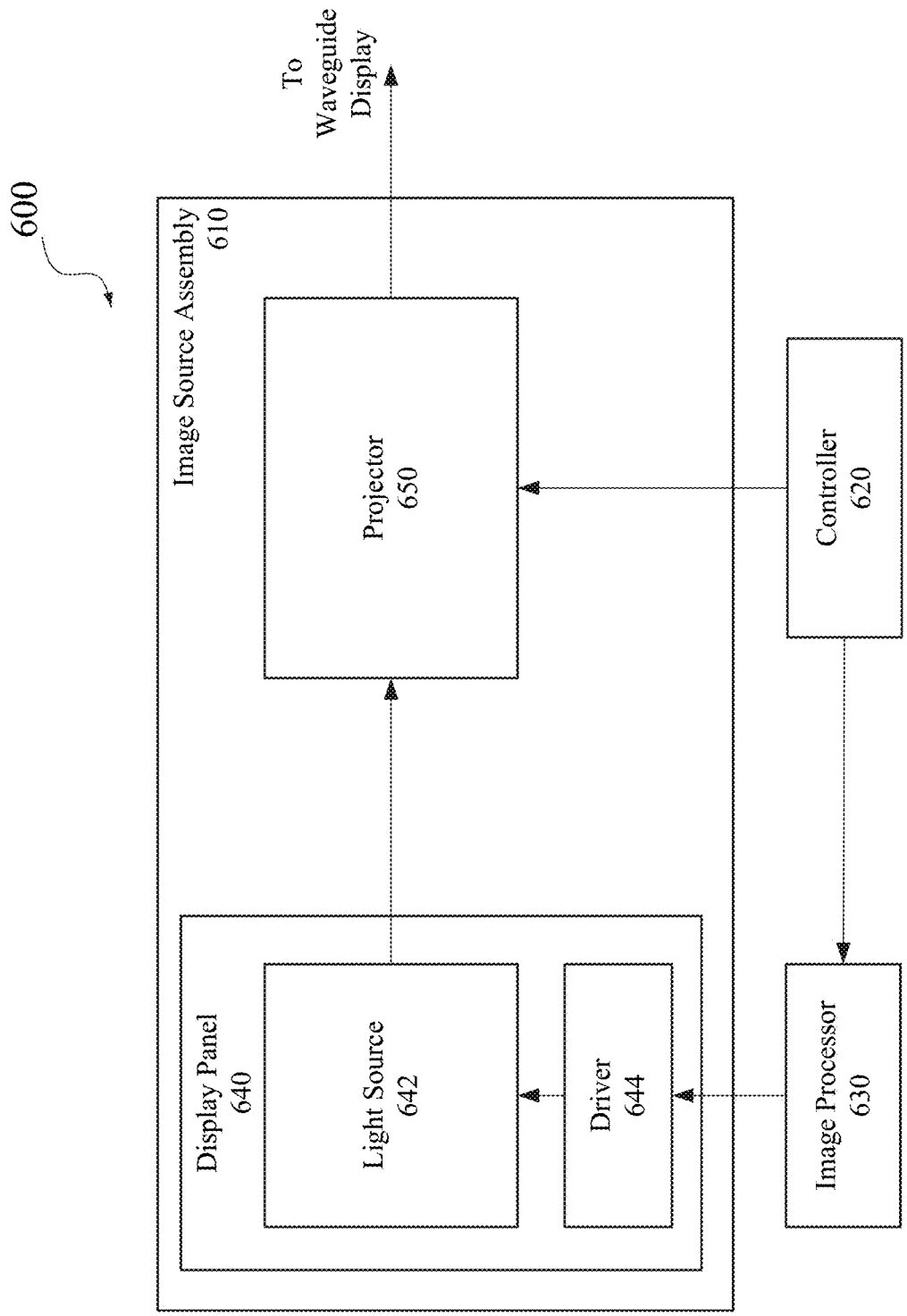
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light-emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

The overall efficiency of a photonic integrated circuit or a waveguide-based display (e.g., in augmented reality system 400 or NED device 500 or 550) may be a product of the efficiency of individual components and may also depend on how the components are connected. For example, the overall efficiency $\eta_{tot}$ of the waveguide-based display in augmented reality system 400 may depend on the light-emitting efficiency of image source 412, the light coupling efficiency from image source 412 into combiner 415 by projector optics 414 and input coupler 430, and the output coupling efficiency of output coupler 440, and thus may be determined as:

$$\eta_{tot} = N_{EQE} \times \eta_{in} \times \eta_{out}, \quad (1)$$

where $\eta_{EQE}$ is the external quantum efficiency of image source 412, $\eta_{in}$ is the in-coupling efficiency of light from image source 412 into the waveguide (e.g., substrate 420), and $\eta_{out}$ is the outcoupling efficiency of light from the waveguide towards the user's eye by output coupler 440. Thus, the overall efficiency $\eta_{tot}$ of the waveguide-based display can be improved by improving one or more of $\eta_{EQE}$, $\eta_{in}$, and $\eta_{out}$.

The optical coupler (e.g., input coupler 430 or coupler 532) that couples the emitted light from a light source to a waveguide may include, for example, a grating, a lens, a micro-lens, a prism. In some embodiments, light from a small light source (e.g., a micro-LED) can be directly (e.g., end-to-end) coupled from the light source to a waveguide, without using an optical coupler. In some embodiments, the optical coupler (e.g., a lens or a parabolic-shaped reflector) may be manufactured on the light source.

The light sources, image sources, or other displays described above may include one or more LEDs. For example, each pixel in a display may include three subpixels that include a red micro-LED, a green micro-LED, and a blue micro-LED. A semiconductor light emitting diode generally includes an active light-emitting layer within multiple layers of semiconductor materials. The multiple layers of semiconductor materials may include different compound materials or a same base material with different dopants and/or different doping densities. For example, the multiple layers of semiconductor materials may generally include an n-type material layer, an active layer that may include hetero-structures (e.g., one or more quantum wells), and a p-type material layer. The multiple layers of semiconductor materials may be grown on a surface of a substrate having a certain orientation.

Photons can be generated in a semiconductor LED (e.g., a micro-LED) at a certain internal quantum efficiency through the recombination of electrons and holes within the active layer (e.g., including one or more semiconductor layers). The generated light may then be extracted from the LEDs in a particular direction or within a particular solid angle. The ratio between the number of emitted photons extracted from the LED and the number of electrons passing through the LED is referred to as the external quantum efficiency, which describes how efficiently the LED converts injected electrons to photons that are extracted from the device. The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device.

The internal quantum efficiency of LEDs may depend on the relative rates of competitive radiative (light producing) recombination and non-radiative (lossy) recombination that occur in the active region of the LEDs. Non-radiative recombination processes in the active region may include Shockley-Read-Hall (SRH) recombination at defect sites and eeh/ehh Auger recombination that involves three carriers. The internal quantum efficiency of an LED may be approximately determined by:

$$IQE = BN^2/AN + BN^2 + CN^3 \qquad (2)$$

where A, B and C are the rates of SRH recombination, bimolecular (radiative) recombination, and Auger recombination, respectively, and N is the charge-carrier density (i.e., charge-carrier concentration) in the active region. For LEDs, and in particular, micro-LEDs with reduced physical dimensions, improving the internal and external quantum efficiency can be challenging. In some embodiments, to form individually addressable micro-LEDs and to increase the light extraction efficiency, a mesa that includes at least some of the layers of semiconductor materials may be formed.

Figure 7A:
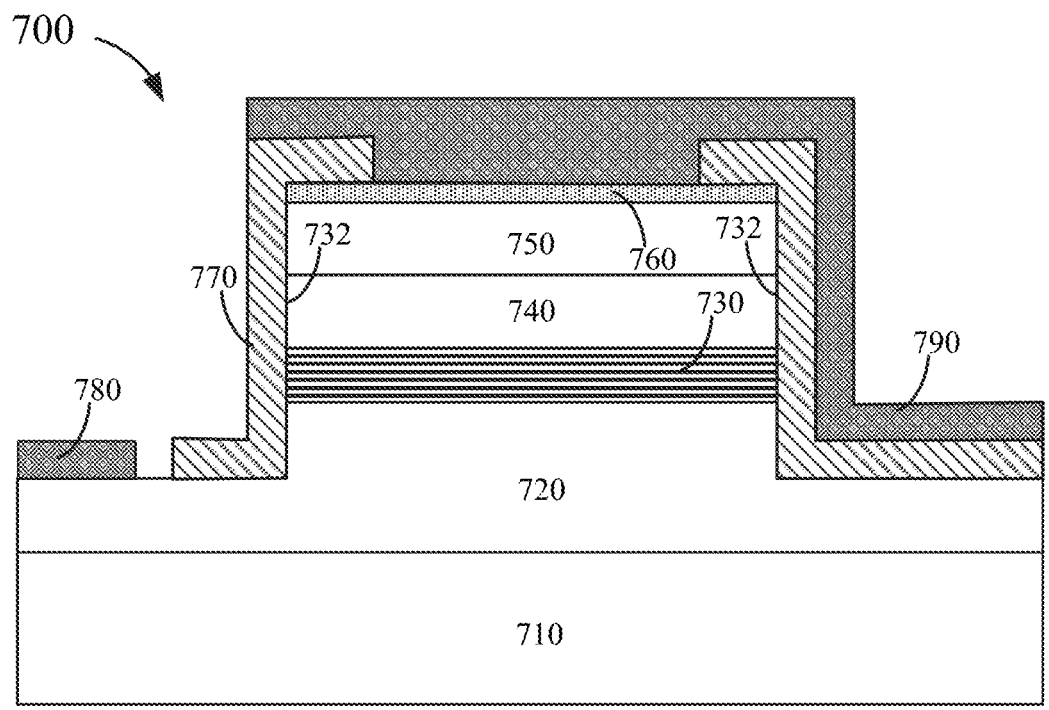
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlGaInP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light-emitting region. For example, LED 700 may include a layer of InGaN situated between a layer of p-type GaN doped with magnesium and a layer of n-type GaN doped with silicon or oxygen. In some embodiments, LED 700 may include a layer of AlGaInP situated between a layer of p-type AlGaInP doped with zinc or magnesium and a layer of n-type AlGaInP doped with selenium, silicon, or tellurium. It is generally desirable to reduce the strains in the semiconductor layers because the strains may cause defects in the crystal lattice, introduce polarization states, and induce internal electric fields by the piezo- and spontaneous polarization.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a P$^+$ or P$^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on mesa sidewalls 732 of the mesa structure. Passivation layer 770 may include an oxide layer, such as a SiO$_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlGaInP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conical shape). The mesa may be truncated or non-truncated.

Figure 7B:
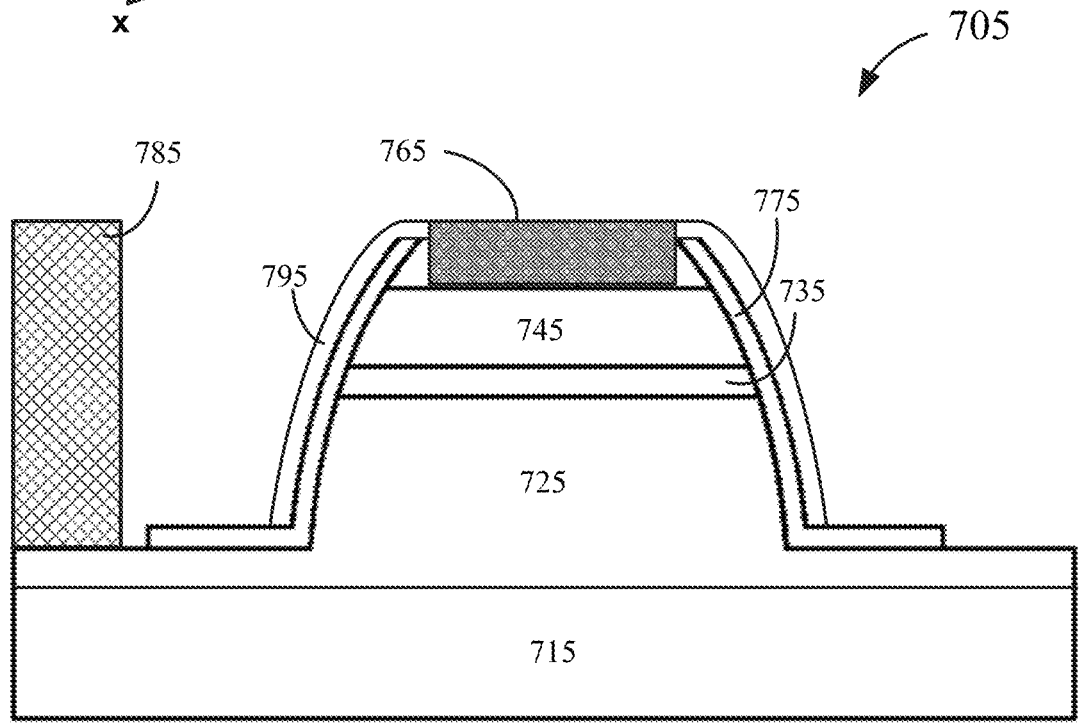
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlGaInP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or $SiN_x$) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlGaInP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

While the Auger recombination due to a high current density (and high charge carrier density) may be an intrinsic process depending on material properties, non-radiative SRH recombination depends on the characteristics and the quality of material, such as the defect density in the active region. As described above with respect to FIGS. 7A and 7B, LEDs may be fabricated by etching mesa structures into the active emitting layers to confine carriers within the mesa structures of the individual LEDs and to expose the n-type material beneath the active emitting layers for electrical contact. Etching the mesa structures may lead to the formation of mesa sidewalls that may be approximately orthogonal to the growth plane. Due to the etching, the active region in proximity to the exposed sidewalls may have a higher density of defects, such as dislocations, dangling bonds, pores, grain boundaries, vacancies, inclusion of precipitates, chemical contamination, structural damages and the like. The defects may introduce energy states having deep or shallow energy levels in the bandgap. Carriers may be trapped by these energy states until they combine non-radiatively. For example, at the sidewall facets, the atomic lattice structure of the semiconductor layers may end abruptly, where some atoms of the semiconductor materials may lack neighbors to which bonds may be attached. This results in "dangling bonds," which may be characterized by unpaired valence electrons. These dangling bonds create energy levels that otherwise would not exist within the bandgap of the semiconductor material, causing non-radiative electron-hole recombination at or near the facets of the mesa structure. Thus, these imperfections may become the recombination centers where electrons and holes may be confined until they combine non-radiatively. Therefore, the active region in proximity to the exposed sidewalls may have a higher rate of SRH recombination than the bulk region that is far from the sidewalls.

For traditional, broad area LEDs used in lighting and backlighting applications (e.g., with a lateral device area about 0.1 $mm^2$ to about 1 $mm^2$), the sidewalls are at the far ends of the devices. The devices can be designed such that little or no current is injected into regions within a minority carrier diffusion length from the mesa sidewalls, and thus the sidewall surface area to volume ratio and the overall rate of SRH recombination may be low. However, in micro-LEDs, as the size of the LED is reduced to a value comparable to or having a same order of magnitude as the minority carrier diffusion length, the increased surface area to volume ratio may lead to a high carrier surface recombination rate, because a greater proportion of the total active region may fall within the minority carrier diffusion length from the LED sidewalls. Therefore, more injected carriers may be subjected to the higher SRH recombination rate. This can cause the leakage current of the LED to increase and the efficiency of the LED to decrease as the size of the LED decreases, and/or cause the peak efficiency operating current to increase as the size of the LED decreases. For example, for a first LED with a 100 µm×100 µm×2 µm mesa, the side-wall surface area to volume ratio may be about 0.04. However, for a second LED with a 5 µm×5 µm×2 µm mesa, the side wall surface area to volume ratio may be about 0.8, which is about 20 times higher than the first LED. Thus, with a similar surface defect density, the SRH recombination coefficient of the second LED may be about 20 times higher as well. Therefore, the efficiency of the second LED may be significantly lower than the first LED.

Figures 8A, 8B:
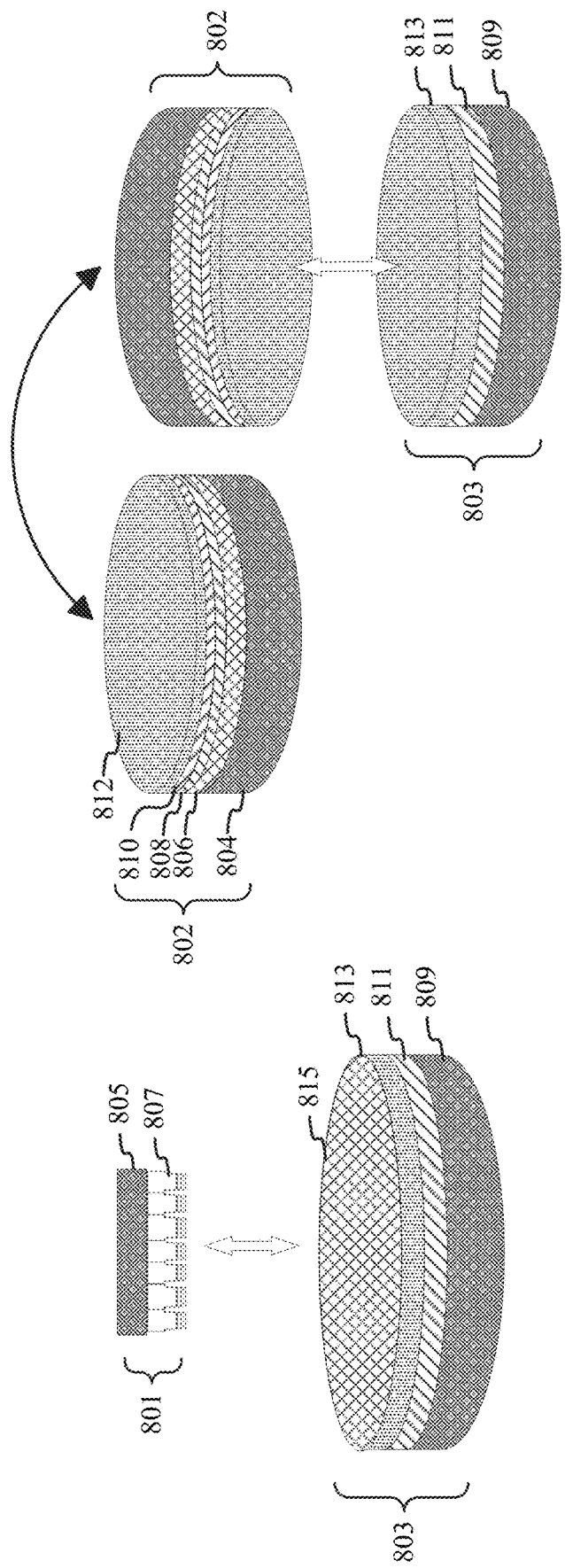
FIG. 8A illustrates an example of a method of die-to-wafer bonding for arrays of LEDs according to certain embodiments.
FIG. 8B illustrates an example of a method of wafer-to-wafer bonding for arrays of LEDs according to certain embodiments.

FIG. 8A illustrates an example of a method of die-to-wafer bonding for arrays of LEDs according to certain embodiments. In the example shown in FIG. 8A, an LED array 801 may include a plurality of LEDs 807 on a carrier substrate 805. Carrier substrate 805 may include various materials, such as GaAs, InP, GaN, AlN, sapphire, SiC, Si, or the like. LEDs 807 may be fabricated by, for example, growing various epitaxial layers, forming mesa structures, and forming electrical contacts or electrodes, before performing the bonding. The epitaxial layers may include various materials, such as GaN, InGaN, AlGaInP, (AlGaIn)AsP, (AlGaIn)AsN, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 803 may include a base layer 809 having passive or active integrated circuits (e.g., driver circuits 811) fabricated thereon. Base layer 809 may include, for example, a silicon wafer. Driver circuits 811 may be used to control the operations of LEDs 807. For example, the driver circuit for each LED 807 may include a 2T1C pixel structure that has two transistors and one capacitor. Wafer 803 may also include a bonding layer 813. Bonding layer 813 may include various materials, such as a metal, an oxide, a dielectric, CuSn, AuTi, and the like. In some embodiments, a patterned layer 815 may be formed on a surface of bonding layer 813, where patterned layer 815 may include a metallic grid made of a conductive material, such as Cu, Ag, Au, Al, or the like.

LED array 801 may be bonded to wafer 803 via bonding layer 813 or patterned layer 815. For example, patterned layer 815 may include metal pads or bumps made of various materials, such as CuSn, AuSn, or nanoporous Au, that may be used to align LEDs 807 of LED array 801 with corresponding driver circuits 811 on wafer 803. In one example, LED array 801 may be brought toward wafer 803 until LEDs 807 come into contact with respective metal pads or bumps corresponding to driver circuits 811. Some or all of LEDs 807 may be aligned with driver circuits 811, and may then be bonded to wafer 803 via patterned layer 815 by various bonding techniques, such as metal-to-metal bonding. After LEDs 807 have been bonded to wafer 803, carrier substrate 805 may be removed from LEDs 807.

FIG. 8B illustrates an example of a method of wafer-to-wafer bonding for arrays of LEDs according to certain embodiments. As shown in FIG. 8B, a first wafer 802 may include a substrate 804, a first semiconductor layer 806, active layers 808, and a second semiconductor layer 810. Substrate 804 may include various materials, such as GaAs, InP, GaN, AlN, sapphire, SiC, Si, or the like. First semiconductor layer 806, active layers 808, and second semiconductor layer 810 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 806 may be an n-type layer, and second semiconductor layer 810 may be a p-type layer. For example, first semiconductor layer 806 may be an n-doped GaN layer (e.g., doped with Si or Ge), and second semiconductor layer 810 may be a p-doped GaN layer (e.g., doped with Mg, Ca, Zn, or Be). Active layers 808 may include, for example, one or more GaN layers, one or more InGaN layers, one or more AlGaInP layers, and the like, which may form one or more heterostructures, such as one or more quantum wells or MQWs.

In some embodiments, first wafer 802 may also include a bonding layer. Bonding layer 812 may include various materials, such as a metal, an oxide, a dielectric, CuSn, AuTi, or the like. In one example, bonding layer 812 may include p-contacts and/or n-contacts (not shown). In some embodiments, other layers may also be included on first wafer 802, such as a buffer layer between substrate 804 and first semiconductor layer 806. The buffer layer may include various materials, such as polycrystalline GaN or AlN. In some embodiments, a contact layer may be between second semiconductor layer 810 and bonding layer 812. The contact layer may include any suitable material for providing an electrical contact to second semiconductor layer 810 and/or first semiconductor layer 806.

First wafer 802 may be bonded to wafer 803 that includes driver circuits 811 and bonding layer 813 as described above, via bonding layer 813 and/or bonding layer 812. Bonding layer 812 and bonding layer 813 may be made of the same material or different materials. Bonding layer 813 and bonding layer 812 may be substantially flat. First wafer 802 may be bonded to wafer 803 by various methods, such as metal-to-metal bonding, eutectic bonding, metal oxide bonding, anodic bonding, thermo-compression bonding, ultraviolet (UV) bonding, and/or fusion bonding.

As shown in FIG. 8B, first wafer 802 may be bonded to wafer 803 with the p-side (e.g., second semiconductor layer 810) of first wafer 802 facing down (i.e., toward wafer 803). After bonding, substrate 804 may be removed from first wafer 802, and first wafer 802 may then be processed from the n-side. The processing may include, for example, the formation of certain mesa shapes for individual LEDs, as well as the formation of optical components corresponding to the individual LEDs.

FIGS. 9A-9D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 9A shows a substrate 910 with passive or active circuits 920 manufactured thereon. As described above with respect to FIGS. 8A-8B, substrate 910 may include, for example, a silicon wafer. Circuits 920 may include driver circuits for the arrays of LEDs. A bonding layer may include dielectric regions 940 and contact pads 930 connected to circuits 920 through electrical interconnects 922. Contact pads 930 may include, for example, Cu, Ag, Au, Al, W, Mo, Ni, Ti, Pt, Pd, or the like. Dielectric materials in dielectric regions 940 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 905. The activated surface may be atomically clean and may be reactive for formation of direct bonds between wafers when they are brought into contact, for example, at room temperature.

FIG. 9B illustrates a wafer 950 including an array of micro-LEDs 970 fabricated thereon as described above with respect to, for example, FIGS. 7A, 7B, 8A, and 8B. Wafer 950 may be a carrier wafer and may include, for example, GaAs, InP, GaN, AlN, sapphire, SiC, Si, or the like. Micro-LEDs 970 may include an n-type layer, an active region, and a p-type layer epitaxially grown on wafer 950. The epitaxial layers may include various III-V semiconductor materials described above, and may be processed from the p-type layer side to etch mesa structures in the epitaxial layers, such as substantially vertical structures, parabolic structures, conical structures, or the like. Passivation layers and/or reflection layers may be formed on the sidewalls of the mesa structures. P-contacts 980 and n-contacts 982 may be formed in a dielectric material layer 960 deposited on the mesa structures and may make electrical contacts with the p-type layer and the n-type layers, respectively. Dielectric materials in dielectric material layer 960 may include, for example, SiCN, $SiO_2$, SiN, $Al_2O_3$, $HfO_2$, $ZrO_2$, $Ta_2O_5$, or the like. P-contacts 980 and n-contacts 982 may include, for example, Cu, Ag, Au, Al, W, Mo, Ni, Ti, Pt, Pd, or the like. The top surfaces of p-contacts 980, n-contacts 982, and dielectric material layer 960 may form a bonding layer. The bonding layer may be planarized and polished using, for example, chemical mechanical polishing, where the polishing may cause dishing in p-contacts 980 and n-contacts 982. The bonding layer may then be cleaned and activated by, for example, an ion (e.g., plasma) or fast atom (e.g., Ar) beam 915. The activated surface may be atomically clean and reactive for formation of direct bonds between wafers when they are brought into contact, for example, at room temperature.

FIG. 9C illustrates a room temperature bonding process for bonding the dielectric materials in the bonding layers. For example, after the bonding layer that includes dielectric regions 940 and contact pads 930 and the bonding layer that includes p-contacts 980, n-contacts 982, and dielectric material layer 960 are surface activated, wafer 950 and micro-LEDs 970 may be turned upside down and brought into contact with substrate 910 and the circuits formed thereon. In some embodiments, compression pressure 925 may be applied to substrate 910 and wafer 950 such that the bonding layers are pressed against each other. Due to the surface activation and the dishing in the contacts, dielectric regions 940 and dielectric material layer 960 may be in direct contact because of the surface attractive force, and may react and form chemical bonds between them because the surface atoms may have dangling bonds and may be in unstable energy states after the activation. Thus, the dielectric materials in dielectric regions 940 and dielectric material layer 960 may be bonded together with or without heat treatment or pressure.

FIG. 9D illustrates an annealing process for bonding the contacts in the bonding layers after bonding the dielectric materials in the bonding layers. For example, contact pads 930 and p-contacts 980 or n-contacts 982 may be bonded together by annealing at, for example, about 210-400° C. or higher. During the annealing process, heat 935 may cause the contacts to expand more than the dielectric materials (due to different coefficients of thermal expansion), and thus may close the dishing gaps between the contacts such that contact pads 930 and p-contacts 980 or n-contacts 982 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light-emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 10:
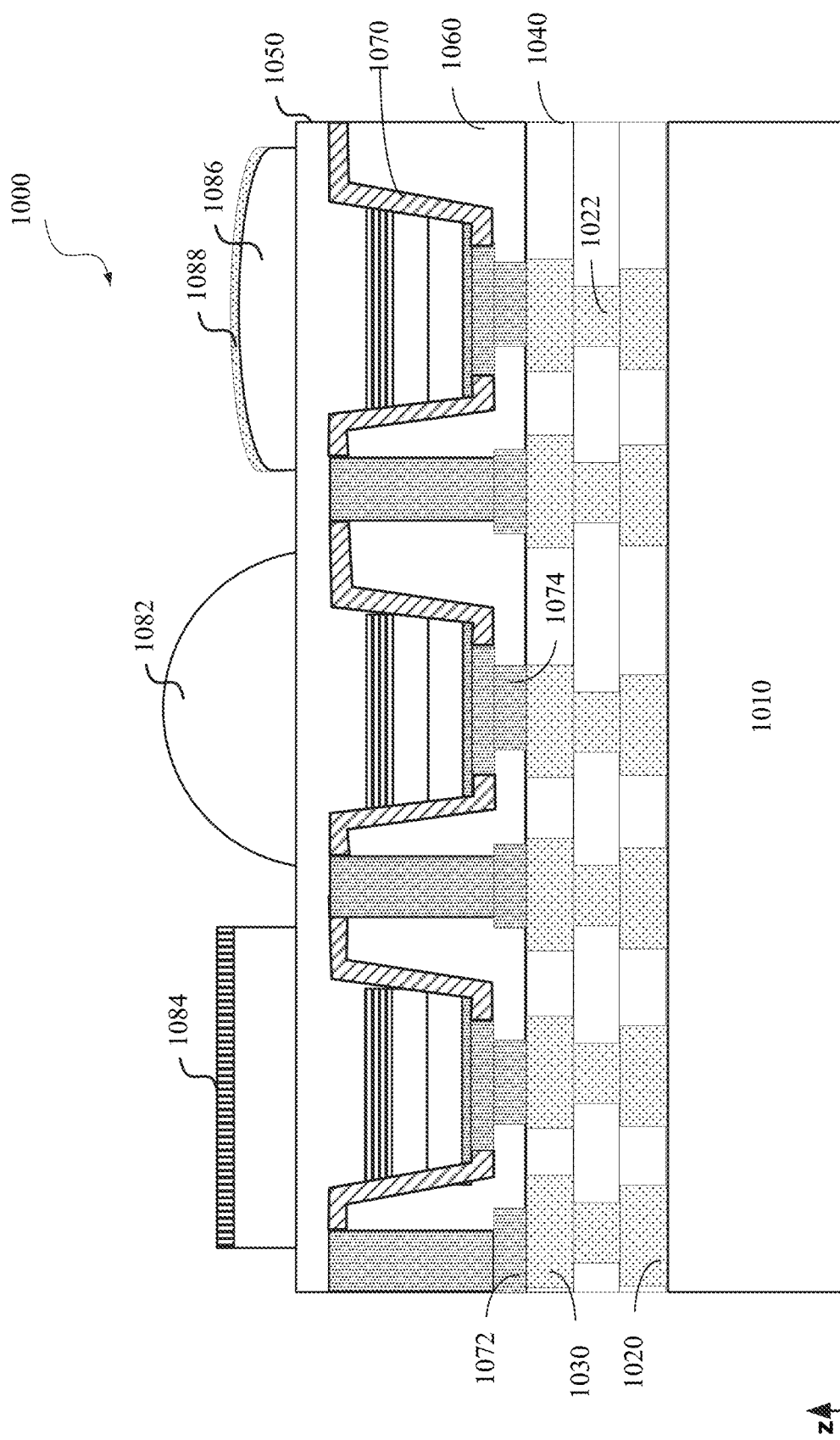
FIG. 10 illustrates an example of an LED array with secondary optical components fabricated thereon according to certain embodiments.

FIG. 10 illustrates an example of an LED array 1000 with secondary optical components fabricated thereon according to certain embodiments. LED array 1000 may be made by bonding an LED chip or wafer with a silicon wafer including electrical circuits fabricated thereon, using any suitable bonding techniques described above with respect to, for example, FIGS. 8A-9D. In the example shown in FIG. 10, LED array 1000 may be bonded using a wafer-to-wafer hybrid bonding technique as described above with respect to FIG. 9A-9D. LED array 1000 may include a substrate 1010, which may be, for example, a silicon wafer. Integrated circuits 1020, such as LED driver circuits, may be fabricated on substrate 1010. Integrated circuits 1020 may be connected to p-contacts 1074 and n-contacts 1072 of micro-LEDs 1070 through interconnects 1022 and contact pads 1030, where contact pads 1030 may form metallic bonds with p-contacts 1074 and n-contacts 1072. Dielectric layer 1040 on substrate 1010 may be bonded to dielectric layer 1060 through fusion bonding.

The substrate (not shown) of the LED chip or wafer may be thinned or may be removed to expose the n-type layer 1050 of micro-LEDs 1070. Various secondary optical components, such as a spherical micro-lens 1082, a grating 1084, a micro-lens 1086, an antireflection layer 1088, and the like, may be formed in or on top of n-type layer 1050. For example, spherical micro-lens arrays may be etched in the semiconductor materials of micro-LEDs 1070 using a grayscale mask and a photoresist with a linear response to exposure light, or using an etch mask formed by thermal reflowing of a patterned photoresist layer. The secondary optical components may also be etched in a dielectric layer deposited on n-type layer 1050 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, a micro-LED 1070 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 10 to show some examples of secondary optical components that can be formed on micro-LEDs 1070, which does not necessary imply that different secondary optical components are used simultaneously for every LED array.

The above-described processes of bonding a micro-LED wafer having epitaxial layers to a backplane wafer with drive circuits may need precise alignment of the two wafers when the pitch of the micro-LEDs on the micro-LED wafer is small (e.g., less than about 5 μm, 3 μm, or 2 μm), which may demand high precision control of wafer bows. However, in red micro-LEDs made in $In_xGa_yAl_zP_{0.5}$ epitaxial layers (where $0<x<0.5$, $0\le y<0.5$, $0\le z<0.5$, and $x+y+z=0.5$) grown on GaAs substrates, the n-type semiconductor (e.g., InGaAlP or InAlP) layer, the InGaAlP/InGaP multiple quantum well layers, and the p-type semiconductor (e.g., InGaAlP or InAlP) layer may generally have in-plane compressive strain due to, for example, the difference between the lattice constant of the GaAs substrate and the lattice constant of the $In_xGa_yAl_zP_{0.5}$ layers. Even though an $In_xGa_yAl_zP_{0.5}$ epitaxial layers may be grown to have either compressive in-plane strain or tensile in-plane strain on a GaAs wafer, in some cases, an $In_xGa_yAl_zP_{0.5}$ epitaxial layer grown with tensile strain or no strain (e.g., lattice matched to the GaAs substrate) may become compressive-strained at room temperature due to different coefficients of temperature expansion (CTEs) of the epitaxial layer and the GaAs substrate. In addition, in some embodiments, in order to improve the quantum efficiency of the micro-LEDs, it may be desirable that the multiple quantum well layers have in-plane compressive strain to increase the proportion of heavy holes and the effective mass of the holes, thereby reducing the mobility of the holes and the diffusion of the holes to the mesa sidewall regions that may cause non-radiative recombination at the mesa sidewall regions. However, the compressive strain in the epitaxial layers may cause a large bow of the wafer that includes the epitaxial layers. Moreover, epitaxial stacks with the same structure and similar strain levels may have different amounts of bow for different wafer sizes. In general, if no strain compensation is applied, wafer bow would increase with wafer size.

Figure 11B:
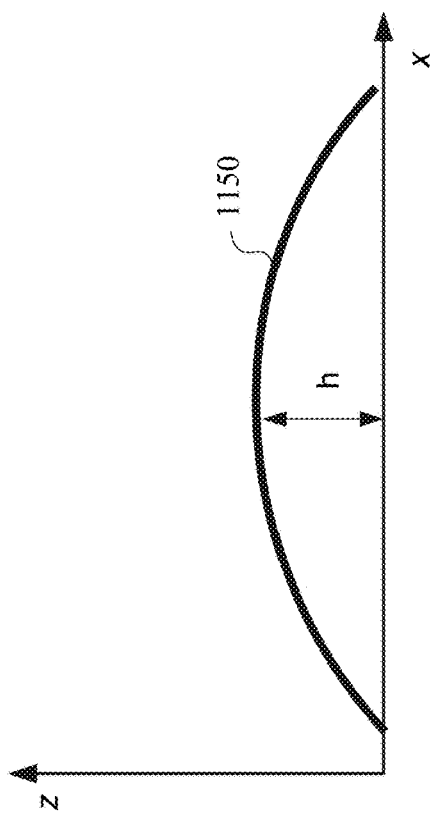
FIG. 11B shows that the compressive strain of epitaxial layers of the micro-LED wafer of FIG. 11A may result in a convex bow of the micro-LED epitaxial wafer.
Figure 11A:
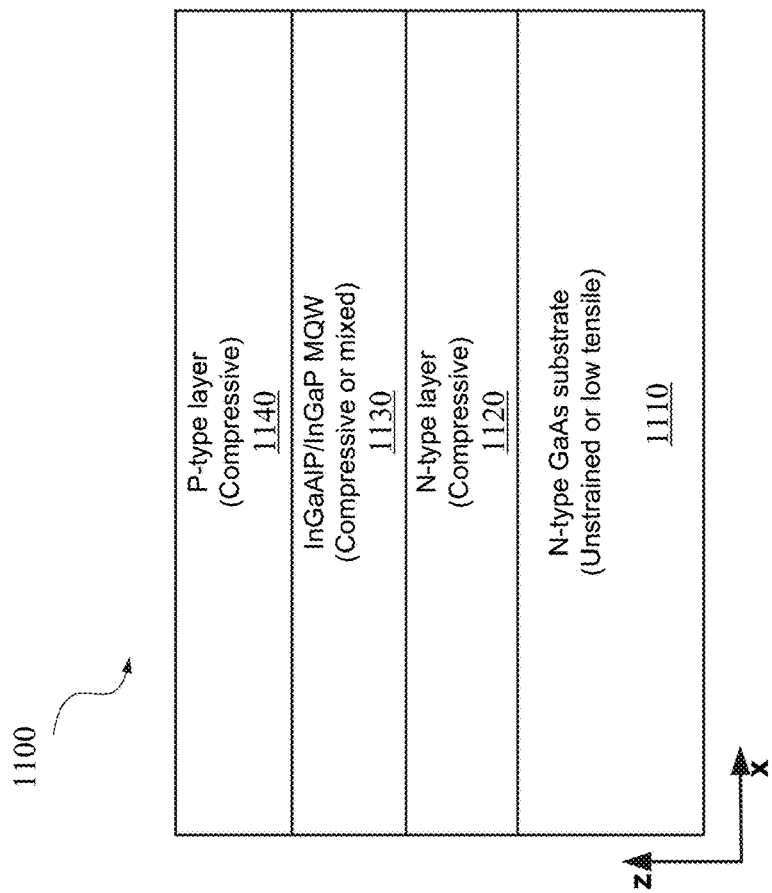
FIG. 11A illustrates an example of an epitaxial structure on a micro-LED wafer.

FIG. 11A illustrates an example of an epitaxial structure 1100 for red micro-LEDs on a micro-LED wafer. In the illustrated example, epitaxial structure 1100 may include a GaAs substrate 1110, which may be n-doped or undoped. GaAs substrate 1110 may have no strain or low tensile strain. In some embodiments, a buffer layer may be grown on GaAs substrate 1110, where the buffer layer may be undoped or n-doped. Epitaxial structure 1100 may also include an n-type layer 1120, MQW layers 1130, and a p-type layer 1140 epitaxially grown on GaAs substrate 1110 (or the buffer layer) using techniques such as VPE, LPE, MBE, or MOCVD. In various embodiments, n-type layer 1120 may include one or more layers, such as an n-contact layer (e.g., an InGaAlP layer), and an n-cladding layer (e.g., an InAlP layer). N-type layer 1120 may have compressive in-plane strain, and may have a thickness about a few hundred nanometers, such as between about 100 nm and a few microns. MQW layers 1130 may include, for example, one or more InGaP quantum well layers and two or more InGaAlP quantum barrier layers. The quantum well layers and the quantum barrier layers may be undoped or may be unintentionally doped. MQW layers 1130 may have compressive in-plane strain, or may have compressive strain in some layers and tensile strain in some layers. Each MQW layer 1130 may have a low thickness, such as less than a few tens of nanometers or less than a few nanometers (e.g., 5 nm, 4 nm, or thinner). The thin layers in MQW layers 1130 may help to reduce the forward bias voltage of the drive signal. P-type layer 1140 may also include one or more layers, such as an electron blocking layer, a cladding layer, a p-side junction layer, and/or one or more p-contact layers. P-type layer 1140 may have a compressive in-plane strain and may have a thickness about a few hundred nanometers.

FIG. 11B shows that the compressive strain of the epitaxial layers of the micro-LED wafer may result in a convex bow of the micro-LED wafer as shown by a curve 1150. Wafer bow may depend on the wafer size, the thickness of the epitaxial layers, and strain levels in the epitaxial layers. For instance, a 3 micrometer thick epitaxial structure with compressive in-plane strain may cause a wafer bow about 80 to 90 microns for a 6-inch wafer. The large bow of the micro-LED wafer may make it very difficult to align and bond the micro-LED wafer with a CMOS backplane.

According to certain embodiments, the bow of the micro-LED wafer with epitaxial layers grown thereon may be controlled by managing the in-plane strain in individual epitaxial layers. Some of the epitaxial layers may be grown to have compressive strain as described above with respect to FIG. 11A, while one or more other epitaxial layers may be grown to have tensile strain. The thickness of the epitaxial layers with tensile strain may be sufficiently high such that the tensile strain of these epitaxial layers may counter the compressive strain of other epitaxial layers, thereby reducing the bow of the micro-LED wafer with the epitaxial layers.

FIG. 12A illustrates an example of an epitaxial structure 1200 that may have balanced strain on a micro-LED wafer for red micro-LEDs according to certain embodiments. In the illustrated example, epitaxial structure 1200 may include a GaAs substrate 1210, which may be n-doped or undoped. In some embodiments, a buffer layer may be grown on GaAs substrate 1210, where the buffer layer may be undoped or n-doped. GaAs substrate 1210 may have no strain or low tensile strain. Epitaxial structure 1200 may also include an n-type layer 1220, MQW layers 1230, and a p-type layer 1240 epitaxially grown on GaAs substrate 1210 (or the buffer layer) using techniques such as VPE, LPE, MBE, or MOCVD. In various embodiments, n-type layer 1220 may include one or more epitaxial layers, such as an n-contact (e.g., InGaAlP) layer, and an n-cladding (e.g., InAlP) layer. N-type layer 1220 may have compressive in-plane strain, and may have a thickness about a few hundred nanometers to about a few microns. MQW layers 1230 may include, for example, one or more InGaP quantum well layers and two or more InGaAlP quantum barrier layers. MQW layers 1230 may have compressive in-plane strain, or may have compressive strain in some layers and tensile strain in some layers. Each MQW layer 1230 may have a low thickness, such as less than a few tens of nanometers or less than a few nanometers (e.g., about 5 nm, 4 nm, or thinner). The thin MQW layers may help to reduce the forward bias voltage of the drive signal. P-type layer 1240 may also include one or more layers, such as an electron blocking layer, a cladding layer, a p-side junction layer, and/or one or more p-contact layers. One or more layers of p-type layer 1240 may have a tensile in-plane strain and may have a total thickness between about 50 nm and about 1000 nm, such as between about 100 nm and about 350 nm, such that the compressive strain and the tensile strain in the epitaxial layers may counter each other to reduce the bow of the micro-LED wafer.

FIG. 12B shows that the micro-LED wafer including strain balanced epitaxial structure 1200 may have little or no wafer bow. A curve 1250 shows that a 6-inch wafer including epitaxial structure 1200 may be substantially flat. For example, the total wafer bow may be less than about 20 μm, less than about 10 μm, less than about 5 μm, or lower. Therefore, it may be much easier to align and bond the micro-LED wafer including epitaxial structure 1200 to a CMOS backplane. The bonding may also be stronger, more accurate, and more reliable.

The compressive or tensile strain may be introduced in an epitaxial layer by changing the lattice constant of the epitaxial layer such that there may be a mismatch between the lattice constant of the epitaxial layer and an adjacent layer, such as the underlying epitaxial layer on which the epitaxial layer is grown. When the lattice constant of the epitaxial layer is lower than that of the adjacent layer, the adjacent layer may pull the crystal lattices of the epitaxial layer and thus there may be tensile strain in the epitaxial layer. When the lattice constant of epitaxial layer is greater than that of the adjacent layer, the adjacent layer may compress the crystal lattices of the epitaxial layer and thus there may be compressive strain in the epitaxial layer. The lattice constants of epitaxial layers may be changed by changing the composition of the epitaxial layers, such as the concentrations of In, Ga, or Al in $In_xGa_yAl_zP_{0.5}$ materials (where $0<x<0.5$, $0\leq y<0.5$, $0\leq z<0.5$, and $x+y+z=0.5$), during the epitaxial growth of the epitaxial layers.

Figure 13:
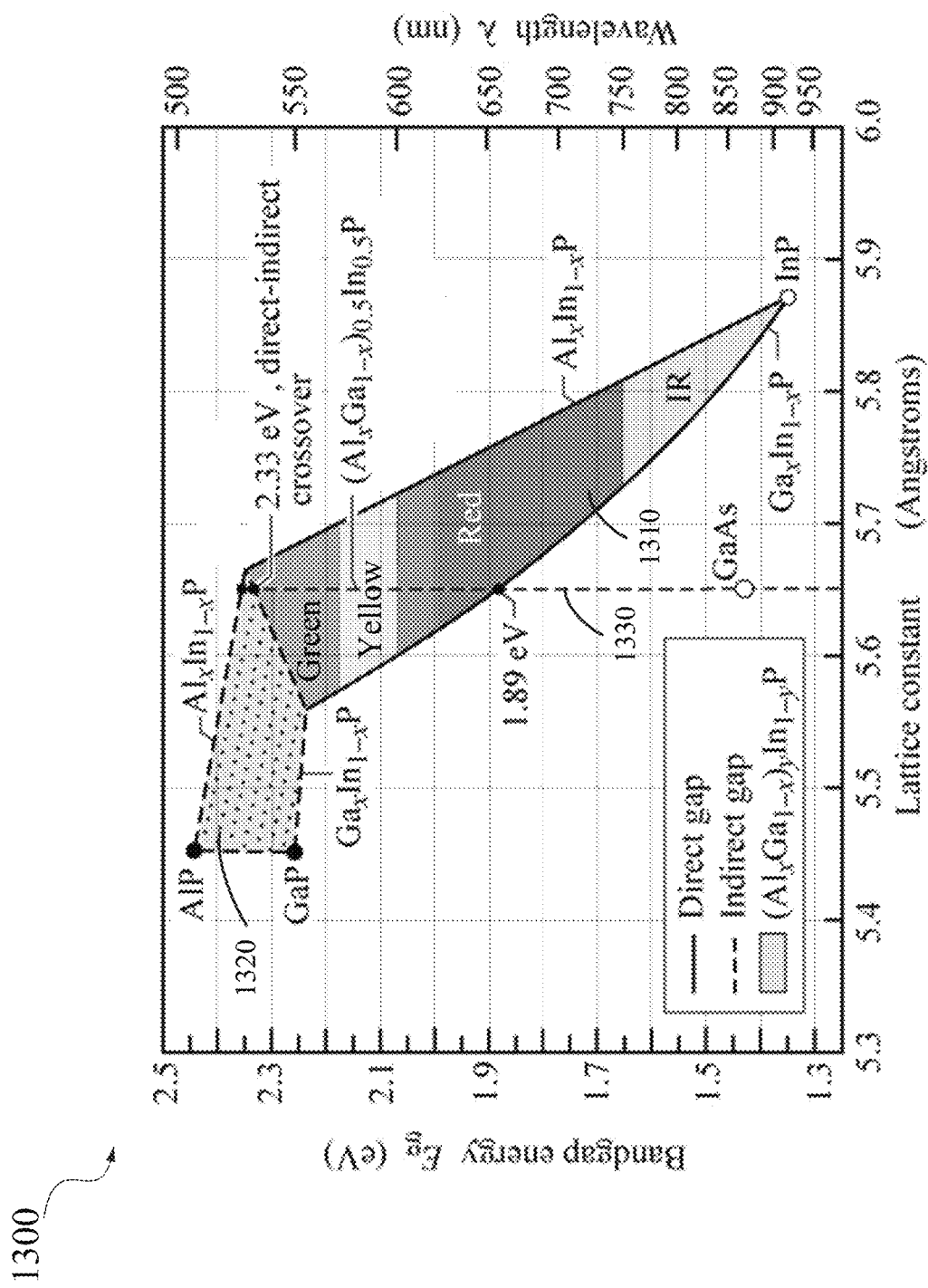
FIG. 13 illustrates bandgap energy levels, corresponding wavelengths, and lattice constants of semiconductor materials having different compositions of Al, Ga, In, and P.

FIG. 13 illustrates bandgap energy levels, corresponding wavelengths, and lattice constants of $In_xGa_yAl_zP_{0.5}$ semiconductor materials having different compositions of Al, Ga, In, and P. In FIG. 13, the horizontal axis corresponds to the lattice constants of the different semiconductor materials, the primary vertical axis corresponds to the energy bandgaps of the semiconductor materials, and the secondary vertical axis shows the wavelengths corresponding to the energy bandgaps. An area 1310 delineated by solid lines corresponds to direct gap semiconductor materials, while an area 1320 delineated by dashed lines corresponds to indirect gap semiconductor materials.

A line 1330 in FIG. 13 shows semiconductor materials having lattice constants matching the lattice constant of GaAs (e.g., about 5.65 Å), which may be used as the substrate for growing the epitaxial layers of red micro-LEDs. As illustrated, $(Al_xGa_{1-x})_{0.25}In_{0.25}P_{0.5}$ may have a lattice constant matching that of GaAs, and thus can be epitaxial grown on a GaAs substrate with little or no defects or strains. When the material of an epitaxial layer has a lattice constant lower than the lattice constant of the underlying layer, the epitaxial layer grown on the underlying layer may experience tensile strain due to the difference between the lattice constants of the epitaxial layer and the underlying layer. For example, for AlGaInP-based red micro-LEDs grown on GaAs substrates, tensile strain may be introduced in an epitaxial layer by using certain compositions of AlGaInP, AlInP, or GaInP semiconductor materials that have shorter lattice constants, such as AlGaInP, AlInP, or GaInP materials on the left of line 1330 in FIG. 13.

Figure 14:
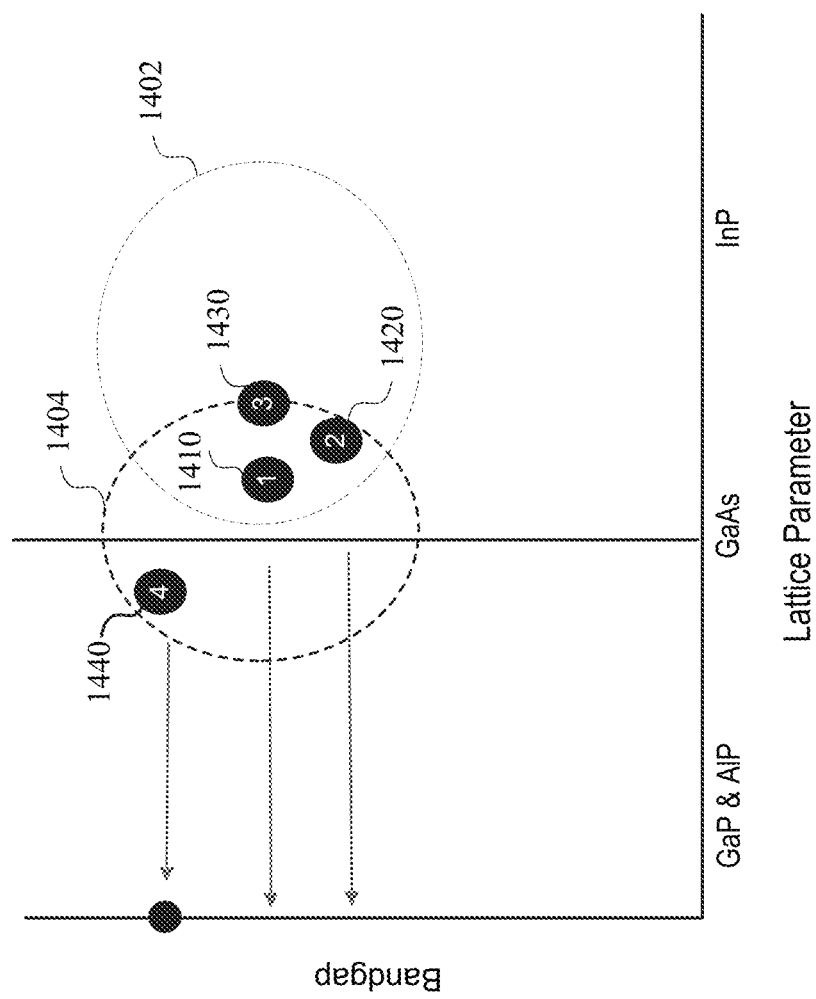
FIG. 14 illustrates examples of semiconductor materials used in epitaxial layers of FIGS. 11A and 12A.

FIG. 14 illustrates examples of semiconductor materials used in epitaxial structure 1100 and epitaxial structure 1200. Materials within a circle 1402 may be used in epitaxial structure 1100. For example, a first material 1410 in FIG. 14 may be used as a material of n-type layer 1120, which may have a lattice constant greater than the lattice constant of the GaAs substrate on which n-type layer 1120 is grown, such that n-type layer 1120 may have a compressive strain. A second material 1420 in FIG. 14 may be used as a material of MQW layers 1130, which may have a lattice constant greater than the lattice constant of first material 1410 on which MQW layers 1130 are grown, and thus MQW layers 1130 may also have a compressive strain. A third material 1430 in FIG. 14 may be used as a material of p-type layer 1140, which may have a lattice constant greater than the lattice constant of second material 1420 on which p-type layer 1140 is grown, and thus p-type layer 1140 may also have a compressive strain. Therefore, epitaxial structure 1100 may have a high overall compressive strain, and hence a high wafer bow. In the example shown in FIG. 14, the energy bandgaps of first material 1410 and third material 1430 may be similar and may be higher than the energy bandgap of second material 1420 for MQW layers 1130.

In contrast, materials within a circle 1404 may be used in epitaxial structure 1200. For example, first material 1410 in FIG. 14 may be used as a material of n-type layer 1220, which may have a lattice constant greater than the lattice constant of the GaAs substrate on which n-type layer 1220 is grown, such that n-type layer 1220 may have a compressive strain. Second material 1420 in FIG. 14 may be used as a material of MQW layers 1230, which may have a lattice constant greater than the lattice constant of first material 1410 on which MQW layers 1230 are grown, and thus MQW layers 1230 may also have a compressive strain. A fourth material 1440 in FIG. 14 may be used as a material of p-type layer 1240, which may have a lattice constant shorter than the lattice constant of second material 1420 on which p-type layer 1240 is grown, and thus p-type layer 1240 may have a tensile strain. In one example, fourth material 1440 may have a higher Al or Ga concentration and/or a lower In concentration. The compressive strain and tensile strain in the epitaxial layers may counter each other to reduce the net strain and thus the bow of the micro-LED wafer. In the example shown in FIG. 14, the energy bandgap of fourth material 1440 for p-type layer 1240 may be higher than the energy bandgaps of first material 1410 and second material 1420.

Figure 15A:
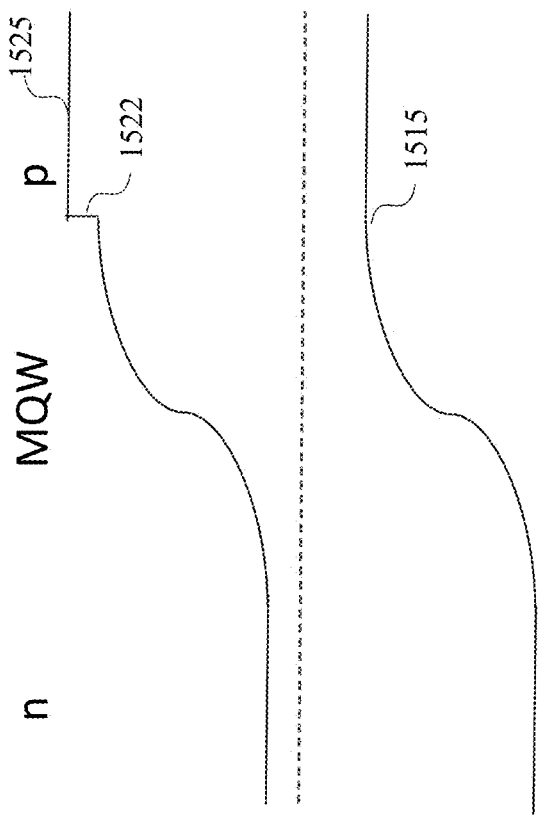
FIG. 15A shows the energy band diagram of an example of an InGaAlP/GaInP red micro-LED.

FIG. 15A shows the energy band diagram of an example of an InGaAlP/GaInP red micro-LED. The example of the InGaAlP/GaInP red micro-LED may be made from epitaxial structure 1100. A curve 1510 shows the valence band of the InGaAlP/GaInP red micro-LED in the n-type layer (e.g., n-type layer 1120), the MQW layers (e.g., MQW layers 1130), and the p-type layer (e.g., p-type layer 1140). A curve 1520 shows the conduction band of the InGaAlP/GaInP red micro-LED in the n-type layer, the MQW layers, and the p-type layer. As illustrated, the conduction band energy barrier for electrons may be low at the p-side. As such, when the operating temperature increases, the conduction band energy barrier for electrons at the p-side may be further reduced, and thus carrier leakage may increase and the efficiency of the LED may decrease. Therefore, InGaAlP/ GaInP red LEDs may be sensitive to temperature and may have a large IQE droop as the operating temperature or the injected current density increases.

The tensile-strained p-type semiconductor layer described above for strain balancing and bow reduction may result in an improvement in the efficiency of micro-LEDs at high operating current densities and elevated temperatures. The tensile-strained p-type semiconductor layer may lead to higher potential barrier for electrons at the p-side of a p-n junction. For example, a tensile-strained layer with a diffraction peak at about 1000 arcsec with respect to the substrate diffraction peak in a high resolution X-ray diffraction (XRD) diagram may result in at least 30 meV increase in the potential barrier height at the p-side of the micro-LED. The increase in the potential barrier height may result in a lower leakage current and a higher wall plug efficiency (WPE) at elevated temperatures and/or high operating current densities.

Figure 15B:
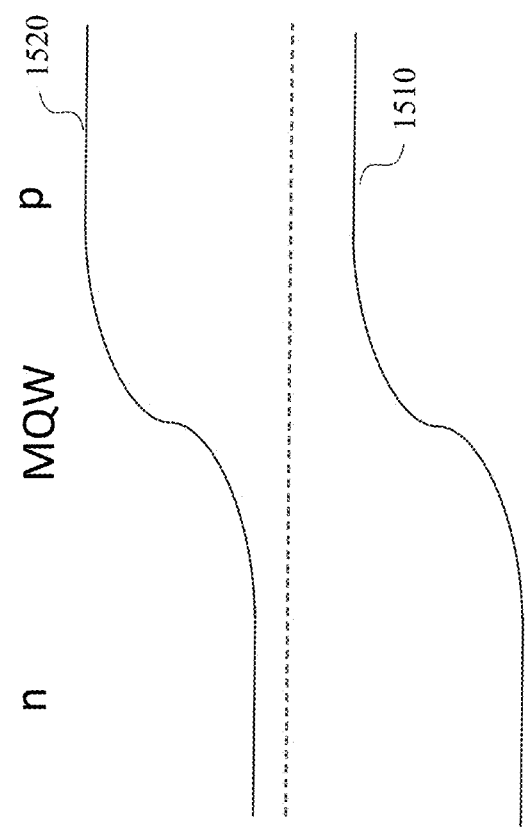
FIG. 15B shows the energy band diagram of an example of an InGaAlP/GaInP red micro-LED including a tensile-strained semiconductor layer on the p-side of the micro-LED according to certain embodiments.

FIG. 15B shows the energy band diagram of an example of an InGaAlP/GaInP red micro-LED including a tensile-strained semiconductor layer on the p-side of the micro-LED according to certain embodiments. The example of the InGaAlP/GaInP red micro-LED may be made from epitaxial structure 1200. A curve 1515 shows the valence band of the InGaAlP/GaInP red micro-LED in the n-type layer (e.g., n-type layer 1220), the MQW layers (e.g., MQW layers 1230), and the p-type layer (e.g., p-type layer 1240). A curve 1525 shows the conduction band of the InGaAlP/GaInP red micro-LED in the n-type layer, the MQW layers, and the p-type layer. As illustrated, at the p-type region of the p-n structure, the tensile-strained p-type semiconductor layer may cause an increase 1522 in the height of the conduction band, which may increase the height of the potential barrier at the p-side of the p-n structure of the micro-LED. As such, the leakage current may be reduced and the efficiency of the micro-LED may be improved, in particular, at higher current densities and higher temperatures.

In some embodiments, the degree of the tensile strain and hence the degree of the efficiency improvement may be tuned by changing the compressive strain in other epitaxial layers of the epitaxial structure. For example, other epitaxial layers may be grown to have higher compressive strain, and the p-type layer may be grown to have higher tensile strain to counter the compressive strain and balance the overall strain of the epitaxial structure. The higher the compressive strain of other epitaxial layers, the higher the tensile strain at the p-side may need to be to control the bow at the macroscopic scale (at wafer level), and hence the higher the efficiency gain may be. The level of the strain and the thickness of the strained epitaxial layer can be controlled to avoid the formation of misfit dislocations at the n-side and p-side of the micro-LED epitaxial structure.

Even though FIG. 12A described above shows that the p-type semiconductor layer of a micro-LED epitaxial structure is tensile-strained to balance the overall strain of the epitaxial structure and improve the efficiency at high current densities and high temperatures, in some embodiments, the tensile-strained layer may be at other locations of an epitaxial layer stack or may be in only a portion of the p-type semiconductor layer of the micro-LED epitaxial structure. For example, in some embodiments, the tensile-strained layer may be the electron blocking layer on the p-side of the p-n structure of the micro-LED. In some embodiments, the tensile-strained layer may be in an n-type semiconductor layer on the n-side of the p-n structure of the micro-LED. In some embodiments, both the n-type semiconductor layer and the p-type semiconductor layer may include a tensile-strained layer having a sufficiently high thickness to balance the overall strain and thus the bow of the epitaxial structure.

Figure 16:
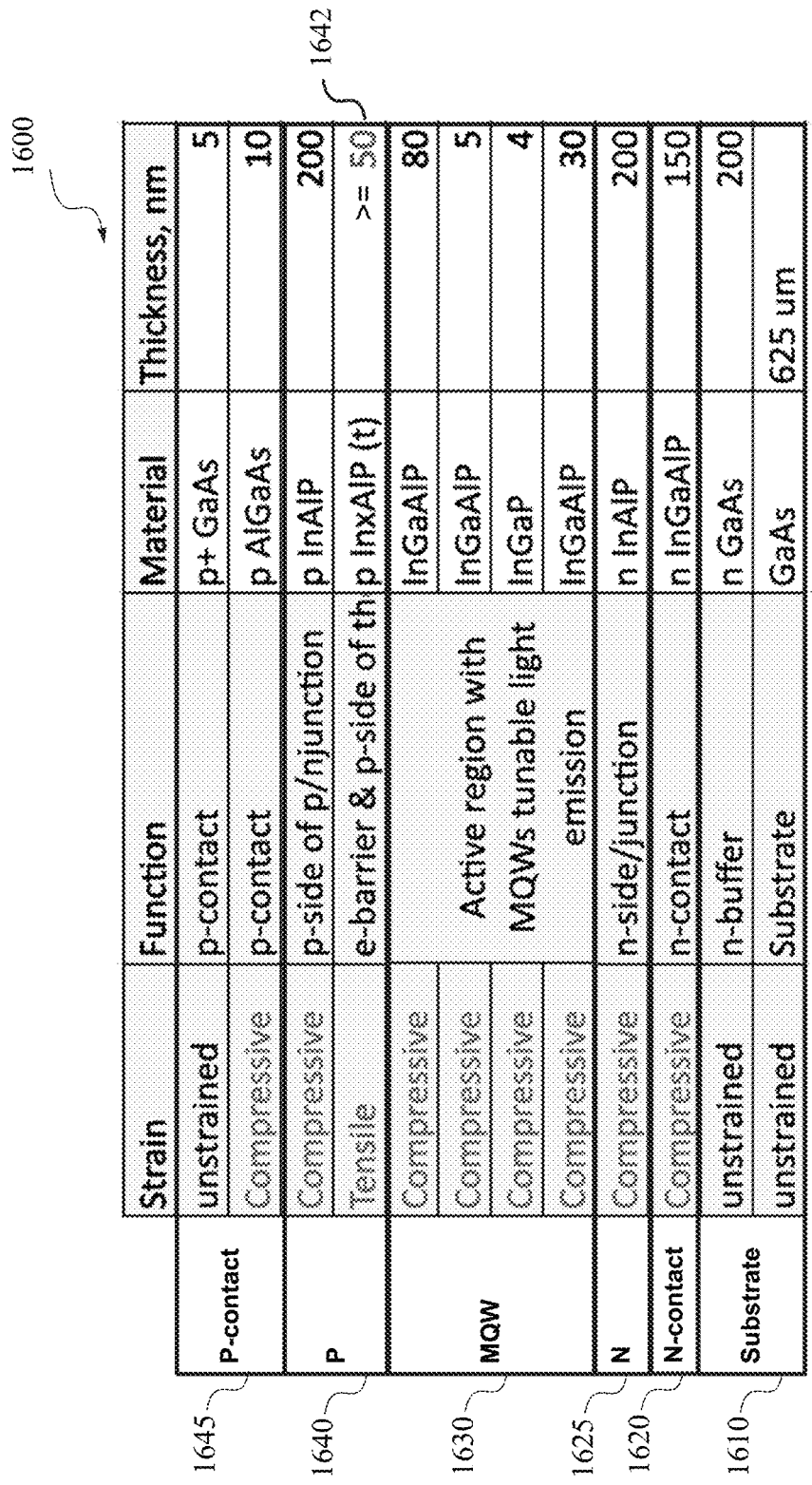
FIG. 16 illustrates an example of a strain-balanced epitaxial layer stack according to certain embodiments.

FIG. 16 illustrates an example of a strain-balanced epitaxial layer stack 1600 for InGaAlP/InGaP red micro-LEDs according to certain embodiments. In the illustrated example, epitaxial layer stack 1600 may include a substrate 1610, an n-contact layer 1620, an n-type layer 1625, MQW layers 1630, a p-type layer 1640, and a p-contact layer 1645. Substrate 1610 may include an undoped, unstrained GaAs wafer that has a thickness of a few hundred microns (e.g., about 625 µm), and may also include an n-doped and unstrained GaAs buffer layer that has a thickness of a few hundred nanometers (e.g., about 200 nm). N-contact layer 1620 may include an n-doped InGaAlP layer having a compressive strain and a thickness about 150 nm. N-type layer 1625 may include an n-doped InAlP layer having a compressive strain and a thickness about 200 nm. MQW layers 1630 may include compressive-strained InGaAlP quantum barrier layers and one or more compressive-strained InGaP quantum well layers. Each InGaP quantum well layer may be between two InGaAlP quantum barrier layers and may have a thickness of a few nanometers. Each InGaAlP quantum barrier layer may have a low thickness, such as less than a few tens of nanometers or less than a few nanometers (e.g., 5 nm, 4 nm, or thinner). The thin epitaxial layers in MQW layers 1630 may help to reduce the forward bias voltage of the drive signal. MQW layers 1630 may be undoped or unintentionally doped. P-type layer 1640 may include a tensile-strained, p-doped $(In_xAl_{1-x})_{0.5}P_{0.5}$ layer 1642 that has a thickness between about 50 nm and about 1000 nm, such as between about 100 nm and about 350 nm. As described above with respect to FIGS. 13 and 14, x may be less than about 0.5 in the p-doped $(In_xAl_{1-x})_{0.5}P_{0.5}$ layer such that the p-doped $(In_xAl_{1-x})_{0.5}P_{0.5}$ layer may have a shorter lattice constant and thus a tensile strain. P-type layer 1640 may also include a compressive-strained, p-doped InAlP layer having a thickness about a few hundred nanometers (e.g., about 200 nm). P-contact layer 1645 may include a compressive-strained p-doped AlGaAs layer and an unstrained $p^+$-doped GaAs layer that each have a thickness between a few nanometers and a few tens of nanometers. In some embodiments, p-contact layer 1645 may include a tensile-strained GaP:C layer rather than a GaAs/AlGaAs:C contact layer stack. The thickness of the GaP:C layer may vary from a few nanometers (e.g., about 3 nm) to up to a few hundred nanometers (e.g., about 300 nm).

As described above, the tensile-strained p-doped layer between MQW layers 1630 and the p-contact may not only balance the strain in epitaxial layer stack 1600 to reduce the bow of epitaxial layer stack 1600, but may also increase the potential barrier for electrons at the p-side of epitaxial layer stack 1600 to reduce the leakage current and improve the efficiency of the micro-LEDs formed using epitaxial layer stack 1600, in particular, at higher current densities and/or higher temperatures. It is noted that FIG. 16 only shows one specific embodiment of a strain-balanced epitaxial structure disclosed herein. Other embodiments of strain-balanced epitaxial structures may have different thicknesses, compositions, layer arrangements, and strain of the epitaxial layers.

Figure 17A:
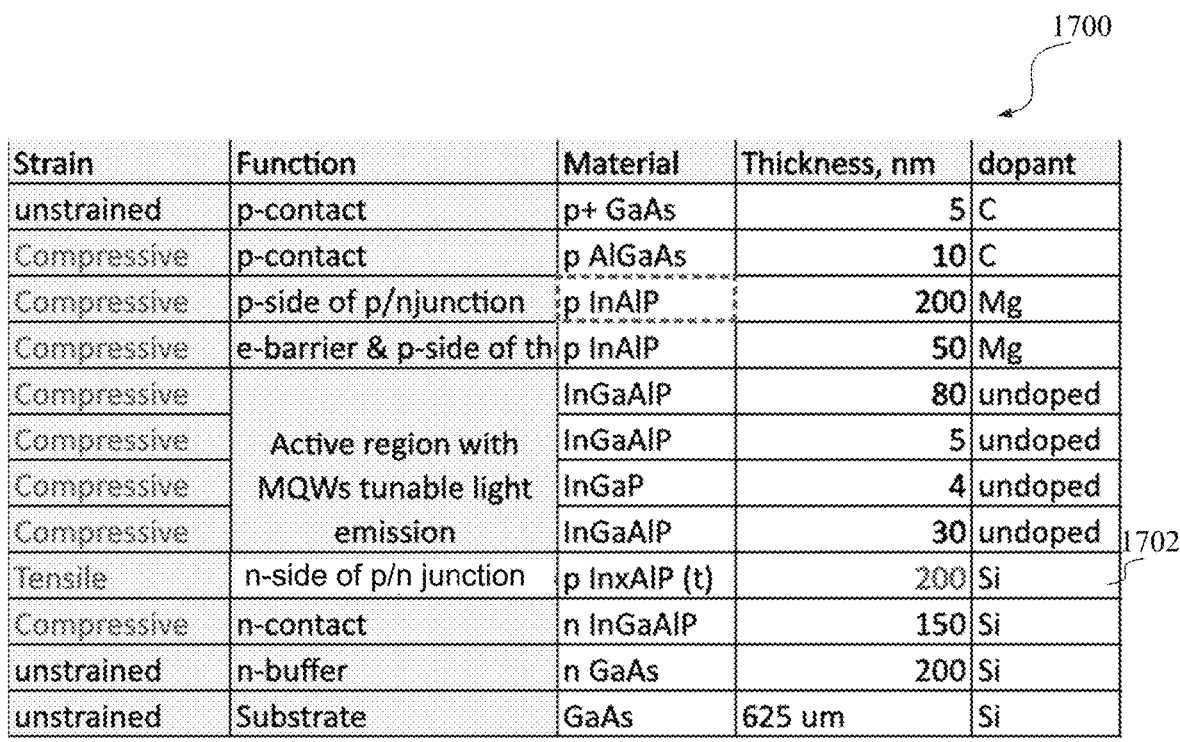
FIG. 17A illustrates another example of a strain-balanced epitaxial layer stack according to certain embodiments.

FIG. 17A illustrates an example of a strain-balanced epitaxial layer stack 1700 for InGaAlP/InGaP red micro-LEDs according to certain embodiments. In the illustrated example, epitaxial layer stack 1700 may be similar to epitaxial layer stack 1600, but may include a tensile-strained layer 1702 in the n-type layer rather than in the p-type layer. In some embodiments, tensile-strained layer 1702 may have a thickness between about 100 nm and 3000 nm, such as about 200 nm.

Figure 17B:
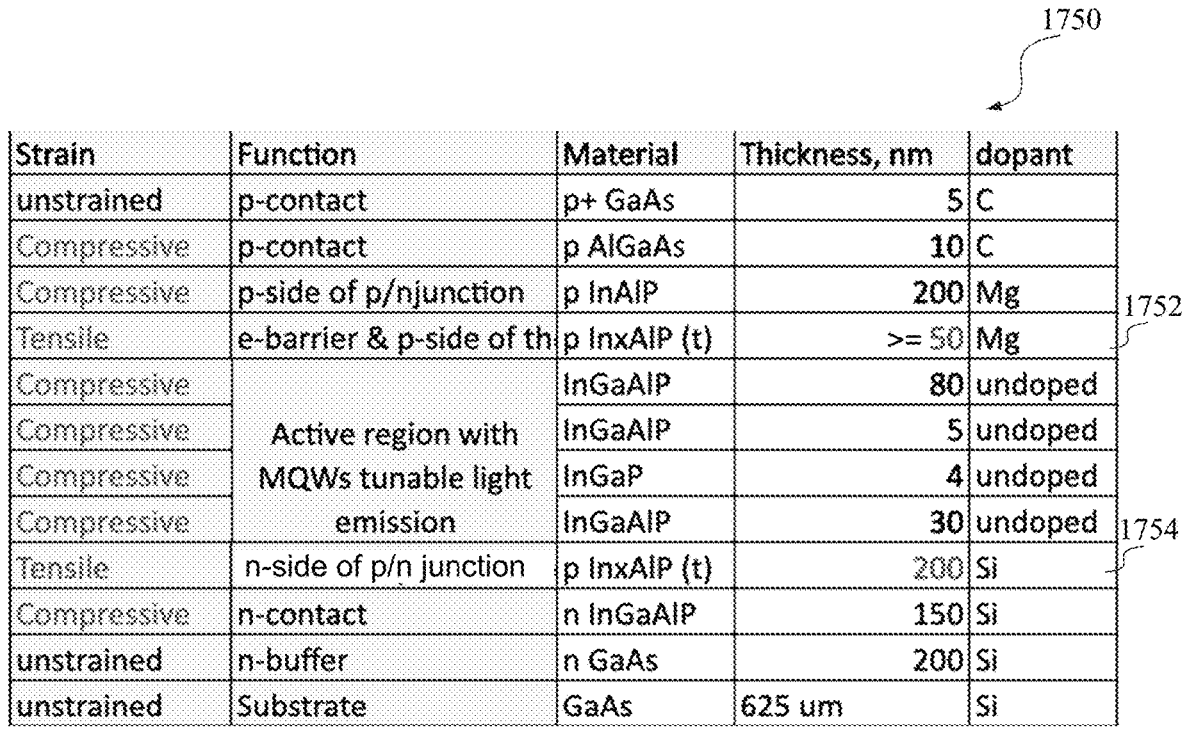
FIG. 17B illustrates yet another example of a strain-balanced epitaxial layer stack according to certain embodiments.

FIG. 17B illustrates an example of a strain-balanced epitaxial layer stack 1750 for InGaAlP/InGaP red micro-LEDs according to certain embodiments. In the illustrated example, epitaxial layer stack 1750 may be similar to epitaxial layer stack 1600, but may include a tensile-strained layer 1752 is in the p-type layer and a tensile-strained layer 1754 in the n-type layer. In some embodiments, tensile-strained layer 1752 may have a thickness between about 50 nm and about 1000 nm, such as between about 100 nm and about 350 nm. In some embodiments, tensile-strained layer 1754 may have a thickness between about 100 nm and 3000 nm, such as about 200 nm.

Figure 18:
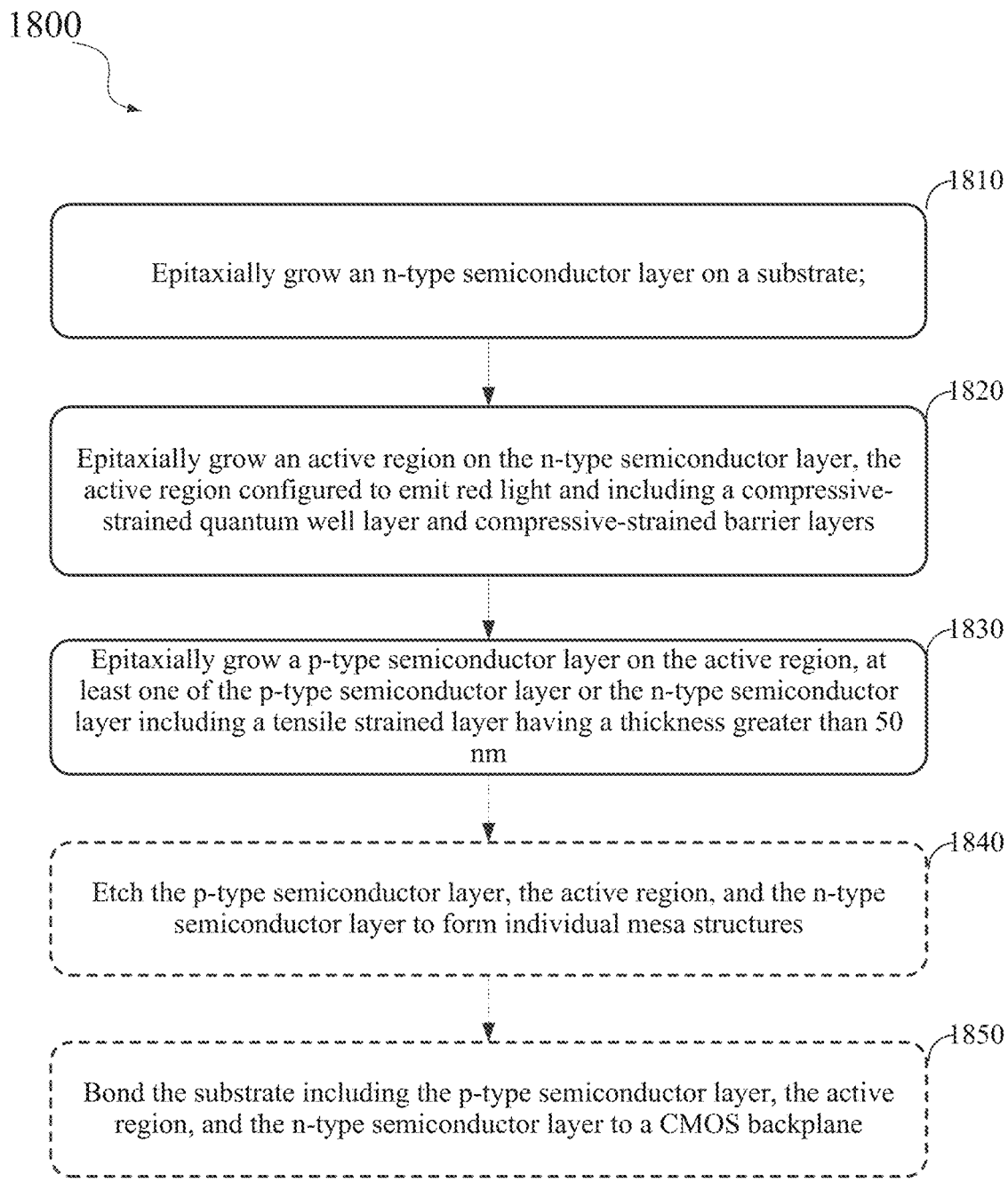
FIG. 18 includes a flowchart illustrating an example of a method of manufacturing a strain-balanced micro-LED wafer according to certain embodiments.

FIG. 18 includes a flowchart 1800 illustrating an example of a method of manufacturing a strain-balanced micro-LED wafer according to certain embodiments. At block 1810, an n-type semiconductor layer may be epitaxially grown on a substrate, such as, for example, a GaAs substrate or a GaAs substrate with a buffer layer (e.g., an n-doped GaAs layer). The n-type semiconductor layer may include, for example, an AlInP or AlGaInP layer doped with silicon, selenium, tellurium, or germanium. The n-type semiconductor layer may be epitaxially grown on the substrate using techniques such as VPE, LPE, MBE, or MOCVD described above. The n-type semiconductor layer may include one or more layers and may have a total thickness about a few hundred nanometers to a few microns.

At block 1820, an active region that includes one or more quantum well layers and a plurality of quantum barrier layers may be epitaxially grown on the n-type semiconductor layer to form an MQW structure. For example, the active region may include one or more InGaAlP quantum barrier layers and at least one InGaP quantum well layer. The quantum well layers and the quantum barrier layers may be epitaxially grown on the n-type semiconductor layer using techniques such as VPE, LPE, MBE, or MOCVD. The MQW structure may be configured to emit red light, such as light with a wavelength greater than 600 nm. The quantum well layers and the quantum barrier layers may be undoped or unintentionally doped. In some embodiments, the active region may have a total thickness less than about 200 nm, less than about 150 nm, less than about 100 nm, or lower. In some embodiments, each of the quantum well layers and the quantum barrier layers may have a thickness less than about 20 nm, such as equal to or less than 10 nm, about 5 nm, about 4 nm, or thinner. The thin quantum barrier layers may help to reduce the forward bias voltage of the drive signal.

The quantum well layers and the quantum barrier layers may be compressive-strained. For example, the quantum barrier layers may have lattice constants longer than the lattice constant of the substrate, and the quantum well layer may have a lattice constant longer than the lattice constants of adjacent quantum barrier layers. The compressive-strained quantum well layer may have a higher carrier density. As such, the effective bandgap may be increased to emit light with a shorter wavelength. In addition, the heavy-hole sub-band and the light-hole sub-band in the valence band may be further separated, such that a larger portion of the holes in the valence band may be heavy holes, thereby increasing the effective mass and lowering the mobility of the holes to reduce the diffusion of holes to the mesa sidewall regions and non-radiative recombination at the mesa sidewall regions.

At block 1830, a p-type semiconductor layer may be epitaxially grown on the active region. The p-type semiconductor layer may include, for example, an AlInP or AlGaInP layer doped with Mg, Ca, Zn, or Be. The p-type semiconductor layer may include one or more layers and may have a total thickness between about tens of nanometers to a few hundred nanometers. At least one of the p-type semiconductor layer or the n-type semiconductor layer may include a tensile-strained layer having a thickness greater than about 50 nm, such as about 50 nm, greater about 100 nm, greater than about 200 nm, or higher. For example, the tensile-strained layer may be in the p-type semiconductor layer, where the tensile-strained layer may also increase a potential barrier for electrons at the p-type semiconductor layer as described above with respect to FIG. 15B. In some embodiments, the tensile-strained layer may include a p-doped $(In_xAl_{1-x})_{0.5}P_{0.5}$, $(In_xGa_{1-x})_{0.5}P_{0.5}$, or $(In_x(GaAl)_{1-x})_{0.5}P_{0.5}$ layer in the p-type semiconductor layer, where x may be less than about 0.5. The tensile-strained layer in the p-type semiconductor layer may have a thickness between about 50 nm and about 1000 nm, such as between about 100 nm and about 350 nm. In some embodiments, the tensile-strained layer is in the p-type semiconductor layer and the n-type semiconductor layer may also include a second tensile-strained layer. The tensile-strained layer in the n-type semiconductor layer may have a thickness between about 100 nm and about 3000 nm, such as between about 200 nm and about 1000 nm. The tensile-strained layer may have a lattice constant lower than a lattice constant of the substrate and a lattice constant of the active region. The tensile strain in the tensile-strained layer may counter the compressive strain in other epitaxial layers, and thus may reduce the bow of the micro-LED wafer. In some embodiments, a total bow of the micro-LED wafer may be less than about 20 µm, less than about 10 µm, or lower. In some embodiments, the tensile-strained layer may be characterized by a diffraction peak greater than 50 arcseconds with respect to a diffraction peak of the substrate in an X-ray diffraction (XRD) diagram.

Optionally, at block 1840, the layer stack that includes the n-type semiconductor layer, the active region, and the p-type semiconductor layer may be etched to form individual mesa structures for individual micro-LEDs. The mesa structure may have, for example, a vertical, conical, parabolic, inward-tilted, or outward-tilted mesa shape.

Optionally, at block 1850, the micro-LED wafer that includes the n-type semiconductor layer, the active region, and the p-type semiconductor layer may be bonded to a backplane that includes drive circuits fabricated, for example, on a silicon wafer using CMOS processes. Various bonding techniques can be used for bonding the micro-LED wafer and the backplane, such as adhesive bonding, metal-to-metal bonding, metal oxide bonding, wafer-to-wafer bonding, die-to-wafer bonding, hybrid bonding, and the like, as described above with respect to, for example, FIGS. 8A-10. Because of the low bow of the micro-LED wafer, the bonding of the micro-LED wafer and the backplane may be easier, stronger, more accurate, and more reliable. In some embodiments, the micro-LED wafer may be bonded to the backplane before the micro-LED wafer is etched to form individual mesa structures for individual micro-LEDs. In some embodiments, the micro-LED wafer may be bonded to the backplane after the micro-LED wafer is etched to form individual mesa structures for individual micro-LEDs.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 19:
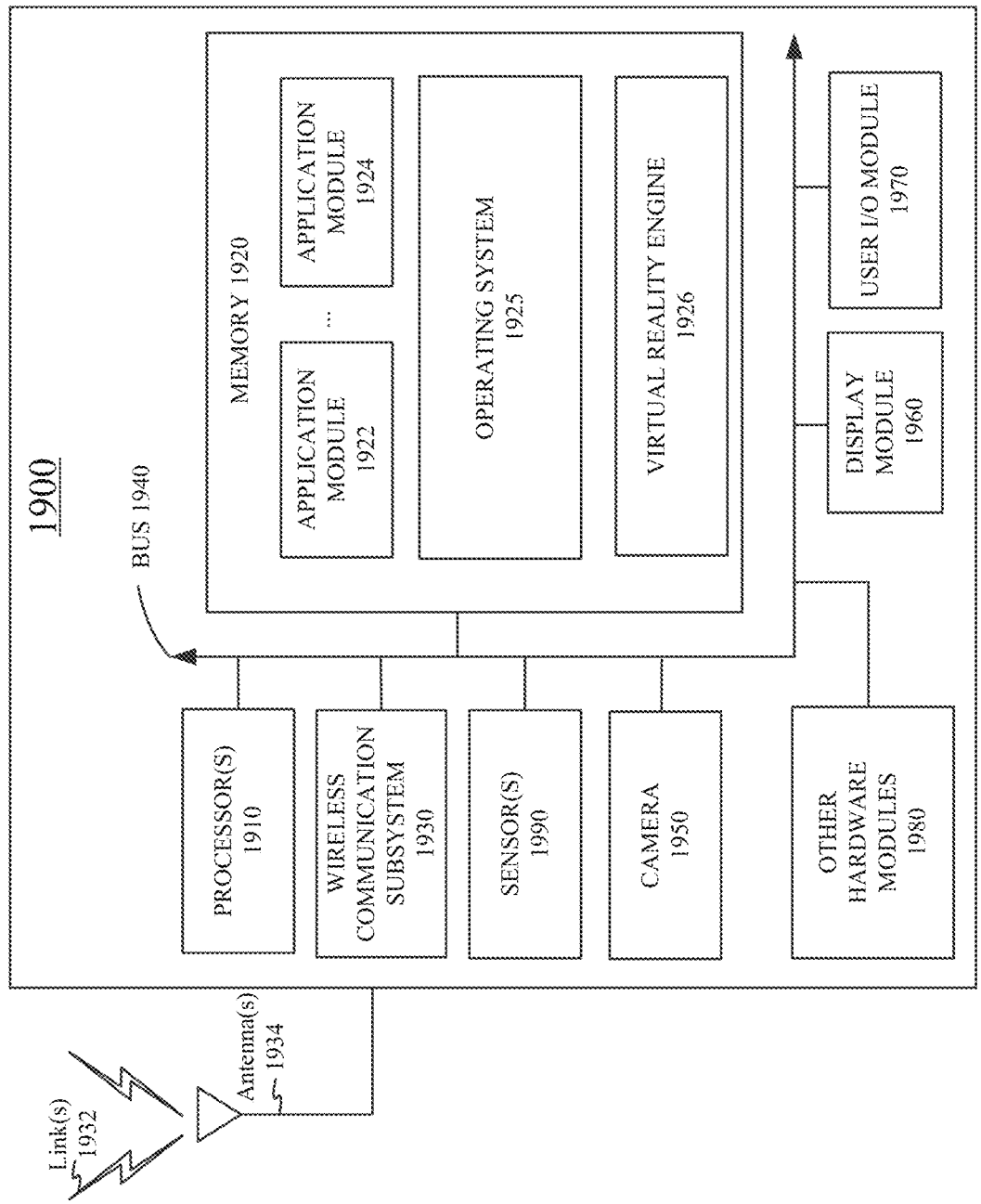
FIG. 19 is a simplified block diagram of an electronic system of an example of a near-eye display according to certain embodiments.

FIG. 19 is a simplified block diagram of an example of an electronic system 1900 of an example near-eye display (e.g., HMD device) for implementing some of the examples disclosed herein. Electronic system 1900 may be used as the electronic system of an HMD device or other near-eye displays described above. In this example, electronic system 1900 may include one or more processor(s) 1910 and a memory 1920. Processor(s) 1910 may be configured to execute instructions for performing operations at a number of components, and can be, for example, a general-purpose processor or microprocessor suitable for implementation within a portable electronic device. Processor(s) 1910 may be communicatively coupled with a plurality of components within electronic system 1900. To realize this communicative coupling, processor(s) 1910 may communicate with the other illustrated components across a bus 1940. Bus 1940 may be any subsystem adapted to transfer data within electronic system 1900. Bus 1940 may include a plurality of computer buses and additional circuitry to transfer data.

Memory 1920 may be coupled to processor(s) 1910. In some embodiments, memory 1920 may offer both short-term and long-term storage and may be divided into several units. Memory 1920 may be volatile, such as static random access memory (SRAM) and/or dynamic random access memory (DRAM) and/or non-volatile, such as read-only memory (ROM), flash memory, and the like. Furthermore, memory 1920 may include removable storage devices, such as secure digital (SD) cards. Memory 1920 may provide storage of computer-readable instructions, data structures, program modules, and other data for electronic system 1900. In some embodiments, memory 1920 may be distributed into different hardware modules. A set of instructions and/or code might be stored on memory 1920. The instructions might take the form of executable code that may be executable by electronic system 1900, and/or might take the form of source and/or installable code, which, upon compilation and/or installation on electronic system 1900 (e.g., using any of a variety of generally available compilers, installation programs, compression/decompression utilities, etc.), may take the form of executable code.

In some embodiments, memory 1920 may store a plurality of application modules 1922 through 1924, which may include any number of applications. Examples of applications may include gaming applications, conferencing applications, video playback applications, or other suitable applications. The applications may include a depth sensing function or eye tracking function. Application modules 1922-1924 may include particular instructions to be executed by processor(s) 1910. In some embodiments, certain applications or parts of application modules 1922-1924 may be executable by other hardware modules 1980. In certain embodiments, memory 1920 may additionally include secure memory, which may include additional security controls to prevent copying or other unauthorized access to secure information.

In some embodiments, memory 1920 may include an operating system 1925 loaded therein. Operating system 1925 may be operable to initiate the execution of the instructions provided by application modules 1922-1924 and/or manage other hardware modules 1980 as well as interfaces with a wireless communication subsystem 1930 which may include one or more wireless transceivers. Operating system 1925 may be adapted to perform other operations across the components of electronic system 1900 including threading, resource management, data storage control and other similar functionality.

Wireless communication subsystem 1930 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1900 may include one or more antennas 1934 for wireless communication as part of wireless communication subsystem 1930 or as a separate component coupled to any portion of the system. Depending on desired functionality, wireless communication subsystem 1930 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN.

Wireless communications subsystem 1930 may permit data to be exchanged with a network, other computer systems, and/or any other devices described herein. Wireless communication subsystem 1930 may include a means for transmitting or receiving data, such as identifiers of HMD devices, position data, a geographic map, a heat map, photos, or videos, using antenna(s) 1934 and wireless link(s) 1932. Wireless communication subsystem 1930, processor(s) 1910, and memory 1920 may together comprise at least a part of one or more of a means for performing some functions disclosed herein.

Embodiments of electronic system 1900 may also include one or more sensors 1990. Sensor(s) 1990 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1990 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 1900 may include a display module 1960. Display module 1960 may be a near-eye display, and may graphically present information, such as images, videos, and various instructions, from electronic system 1900 to a user. Such information may be derived from one or more application modules 1922-1924, virtual reality engine 1926, one or more other hardware modules 1980, a combination thereof, or any other suitable means for resolving graphical content for the user (e.g., by operating system 1925). Display module 1960 may use LCD technology, LED technology (including, for example, OLED, ILED, u-LED, AMOLED, TOLED, etc.), light-emitting polymer display (LPD) technology, or some other display technology.

Electronic system 1900 may include a user input/output module 1970. User input/output module 1970 may allow a user to send action requests to electronic system 1900. An action request may be a request to perform a particular action. For example, an action request may be to start or end an application or to perform a particular action within the application. User input/output module 1970 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1900. In some embodiments, user input/output module 1970 may provide haptic feedback to the user in accordance with instructions received from electronic system 1900. For example, the haptic feedback may be provided when an action request is received or has been performed.

Electronic system 1900 may include a camera 1950 that may be used to take photos or videos of a user, for example, for tracking the user's eye position. Camera 1950 may also be used to take photos or videos of the environment, for example, for VR, AR, or MR applications. Camera 1950 may include, for example, a complementary metal-oxide semiconductor (CMOS) image sensor with a few millions or tens of millions of pixels. In some implementations, camera 1950 may include two or more cameras that may be used to capture 3-D images.

In some embodiments, electronic system 1900 may include a plurality of other hardware modules 1980. Each of other hardware modules 1980 may be a physical module within electronic system 1900. While each of other hardware modules 1980 may be permanently configured as a structure, some of other hardware modules 1980 may be temporarily configured to perform specific functions or temporarily activated. Examples of other hardware modules 1980 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1980 may be implemented in software.

In some embodiments, memory 1920 of electronic system 1900 may also store a virtual reality engine 1926. Virtual reality engine 1926 may execute applications within electronic system 1900 and receive position information, acceleration information, velocity information, predicted future positions, or any combination thereof of the HMD device from the various sensors. In some embodiments, the information received by virtual reality engine 1926 may be used for producing a signal (e.g., display instructions) to display module 1960. For example, if the received information indicates that the user has looked to the left, virtual reality engine 1926 may generate content for the HMD device that mirrors the user's movement in a virtual environment. Additionally, virtual reality engine 1926 may perform an action within an application in response to an action request received from user input/output module 1970 and provide feedback to the user. The provided feedback may be visual, audible, or haptic feedback. In some implementations, processor(s) 1910 may include one or more GPUs that may execute virtual reality engine 1926.

In various implementations, the above-described hardware and modules may be implemented on a single device or on multiple devices that can communicate with one another using wired or wireless connections. For example, in some implementations, some components or modules, such as GPUs, virtual reality engine 1926, and applications (e.g., tracking application), may be implemented on a console separate from the head-mounted display device. In some implementations, one console may be connected to or support more than one HMD.

In alternative configurations, different and/or additional components may be included in electronic system 1900. Similarly, functionality of one or more of the components can be distributed among the components in a manner different from the manner described above. For example, in some embodiments, electronic system 1900 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A micro-light emitting diode (micro-LED) wafer comprising:
   a substrate;
   an n-type semiconductor layer grown on the substrate;
   an active region grown on the n-type semiconductor layer and configured to emit visible light, the active region including a compressive-strained quantum well layer and compressive-strained quantum barrier layers; and
   a p-type semiconductor layer grown on the active region, wherein at least one of the p-type semiconductor layer or the n-type semiconductor layer includes a tensile-strained layer having a lattice constant lower than a lattice constant of the substrate and a lattice constant of the active region.

2. The micro-LED wafer of claim 1, wherein the tensile-strained layer is in the p-type semiconductor layer.

3. The micro-LED wafer of claim 2, wherein the tensile-strained layer increases a potential barrier for electrons at the p-type semiconductor layer.

4. The micro-LED wafer of claim 2, wherein the tensile-strained layer includes a p-doped $(In_xAl_{1-x})_{0.5}P$, $(In_xGa_{1-x})_{0.5}P$, or $(In_x(GaAl)_{1-x})_{0.5}P_{0.5}$ layer in the p-type semiconductor layer.

5. The micro-LED wafer of claim 4, wherein x is less than 0.5.

6. The micro-LED wafer of claim 1, wherein:
the tensile-strained layer is in the p-type semiconductor layer; and
the n-type semiconductor layer includes a second tensile-strained layer.

7. The micro-LED wafer of claim 1, wherein the tensile-strained layer is characterized by a thickness greater than 50 nm.

8. The micro-LED wafer of claim 1, wherein a total bow of the micro-LED wafer is less than 10 μm.

9. The micro-LED wafer of claim 1, wherein the tensile-strained layer is characterized by a diffraction peak greater than 50 arcseconds with respect to a diffraction peak of the substrate in an X-ray diffraction (XRD) diagram.

10. The micro-LED wafer of claim 1, wherein:
the substrate includes a GaAs substrate or a GaAs substrate with a GaAs buffer layer; and
the active region includes one or more InGaAlP quantum barrier layers and at least one InGaP quantum well layer and is configured to emit red light.

11. A device comprising:
a substrate; and
an array of micro-light emitting diodes on the substrate, each micro-light emitting diode of the array of micro-light emitting diodes comprising a mesa structure that comprises:
an n-type semiconductor layer on the substrate;
an active region grown on the n-type semiconductor layer and configured to emit visible light, the active region including a compressive-strained quantum well layer and compressive-strained quantum barrier layers; and
a p-type semiconductor layer on the active region,
wherein at least one of the p-type semiconductor layer or the n-type semiconductor layer includes a tensile-strained layer having a lattice constant lower than a lattice constant of the substrate and a lattice constant of the active region.

12. The device of claim 11, wherein the tensile-strained layer is in the p-type semiconductor layer and increases a potential barrier for electrons at the p-type semiconductor layer.

13. The device of claim 11, wherein the tensile-strained layer is in the p-type semiconductor layer and the n-type semiconductor layer includes a second tensile-strained layer.

14. The device of claim 11, wherein the tensile-strained layer is characterized by a thickness greater than 50 nm.

15. The device of claim 11, wherein the tensile-strained layer is characterized by a diffraction peak greater than 50 arcseconds with respect to a diffraction peak of the substrate in an X-ray diffraction (XRD) diagram.

16. The device of claim 11, wherein:
the substrate includes a GaAs substrate or a GaAs substrate with a GaAs buffer layer; and
the active region includes one or more InGaAlP quantum barrier layers and at least one InGaP quantum well layer and is configured to emit red light.

17. A method comprising:
epitaxially growing an n-type semiconductor layer on a substrate;
epitaxially growing an active region on the n-type semiconductor layer, the active region configured to emit red light and including a compressive-strained quantum well layer and compressive-strained quantum barrier layers; and
epitaxially growing a p-type semiconductor layer on the active region,
wherein at least one of the p-type semiconductor layer or the n-type semiconductor layer includes a tensile-strained layer having a lattice constant lower than a lattice constant of the substrate and a lattice constant of the active region.

18. The method of claim 17, wherein the tensile-strained layer is in the p-type semiconductor layer and increases a potential barrier for electrons at the p-type semiconductor layer.

19. The method of claim 17, wherein the tensile-strained layer is characterized by a diffraction peak greater than 50 arcseconds with respect to a diffraction peak of the substrate in an X-ray diffraction (XRD) diagram.

20. The method of claim 17, wherein the tensile-strained layer is characterized by a thickness greater than 50 nm.

* * * * *